(12) United States Patent
Kuniya et al.

(10) Patent No.: US 8,198,667 B2
(45) Date of Patent: Jun. 12, 2012

(54) SEMICONDUCTOR MEMORY DEVICE AND METHOD FOR MANUFACTURING SAME

(75) Inventors: Takuji Kuniya, Tokyo (JP); Yosuke Komori, Tokyo (JP); Ryota Katsumata, Tokyo (JP); Yoshiaki Fukuzumi, Tokyo (JP); Masaru Kito, Tokyo (JP); Masaru Kidoh, Tokyo (JP); Hiroyasu Tanaka, Tokyo (JP); Megumi Ishiduki, Tokyo (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 184 days.

(21) Appl. No.: 12/808,321

(22) PCT Filed: Dec. 25, 2008

(86) PCT No.: PCT/JP2008/003968
§ 371 (c)(1),
(2), (4) Date: Jun. 15, 2010

(87) PCT Pub. No.: WO2009/084206
PCT Pub. Date: Jul. 9, 2009

(65) Prior Publication Data
US 2010/0276743 A1  Nov. 4, 2010

(30) Foreign Application Priority Data

Dec. 27, 2007 (JP) .................................. 2007-336612
Jul. 8, 2008 (JP) .................................. 2008-177988

(51) Int. Cl.
*H01L 27/115* (2006.01)
*H01L 21/8247* (2006.01)
*H01L 29/792* (2006.01)
*H01L 29/788* (2006.01)

(52) U.S. Cl. ........... 257/315; 257/E21.68; 257/E27.103; 257/E29.3; 257/E29.309; 438/594

(58) Field of Classification Search .................. 257/315, 257/E21.68, E27.103, E29.3, E29.309; 438/594
See application file for complete search history.

(56) References Cited

U.S. PATENT DOCUMENTS 7,781,807 B2 * 8/2010 Nishihara et al. ............. 257/250
(Continued)

FOREIGN PATENT DOCUMENTS

JP  2004 95918  3/2004
(Continued)

OTHER PUBLICATIONS

Office Action issued on Jul. 13, 2011 in the corresponding Korean Patent Application No. 10-2010-7014105 (with English Translation).

*Primary Examiner* — David S Blum
(74) *Attorney, Agent, or Firm* — Oblon, Spivak, McClelland, Maier & Neustadt, L.L.P.

(57) ABSTRACT

A laminated body is formed by alternately laminating a plurality of dielectric films and electrode films on a silicon substrate. Next, a through hole extending in the lamination direction is formed in the laminated body. Next, a selective nitridation process is performed to selectively form a charge layer made of silicon nitride in a region of an inner surface of the through hole corresponding to the electrode film. Next, a high-pressure oxidation process is performed to form a block layer made of silicon oxide between the charge layer and the electrode film. Next, a tunnel layer made of silicon oxide is formed on an inner side surface of the through hole. Thus, a flash memory can be manufactured in which the charge layer is split for each electrode film.

10 Claims, 18 Drawing Sheets

U.S. PATENT DOCUMENTS

| | | |
|---|---|---|
| 7,910,979 B2 * | 3/2011 | Matsuoka et al. ............ 257/324 |
| 2004/0043638 A1 | 3/2004 | Nansei et al. |
| 2004/0104425 A1 | 6/2004 | Kobayashi et al. |
| 2007/0252201 A1 | 11/2007 | Kito et al. |
| 2008/0099819 A1 | 5/2008 | Kito et al. |

FOREIGN PATENT DOCUMENTS

| | | |
|---|---|---|
| JP | 2004 179387 | 6/2004 |
| JP | 2007 266143 | 10/2007 |
| JP | 2007 317874 | 12/2007 |

* cited by examiner

SEMICONDUCTOR MEMORY DEVICE AND METHOD FOR MANUFACTURING SAME

RELATED APPLICATIONS

This application is a 371 of PCT/JP2008/003968 filed Dec. 25, 2008 and claims priority to Japanese application 2007-336612 filed Dec. 27, 2007 and Japanese application 2008/177988 filed Jul. 8, 2008.

TECHNICAL FIELD

This invention relates to a nonvolatile semiconductor memory device and a method for manufacturing the same, and more particularly to a nonvolatile semiconductor memory device including a plurality of dielectric films and electrode films alternately laminated on a substrate, and a method for manufacturing the same.

BACKGROUND ART

Recently, to increase the density of flash memory, a technique for multilayering cells has been developed. In this technique, dielectric films and electrode films are alternately laminated on a substrate, and then collectively provided with a through hole. A charge layer for retaining charge is formed on the inner surface of this through hole, and a columnar electrode is buried inside the through hole. Thus, a flash memory with cell transistors laminated in a three-dimensional manner can be fabricated (see, e.g., Patent Citation 1).

However, the flash memory thus fabricated has the problem of low reliability in retaining data for a long period of time.
Patent Citation 1: Patent 2007-266143

DISCLOSURE OF INVENTION

Technical Problem

This invention provides a highly reliable semiconductor memory device and a method for manufacturing the same.

Technical Solution

According to an aspect of the invention, there is provided a semiconductor memory device including: a substrate; a plurality of dielectric films and electrode films alternately laminated on the substrate and having a through hole extending in the lamination direction; a tunnel layer formed on an inner side surface of the through hole and made of a dielectric material; a charge layer formed between the tunnel layer and the electrode film and made of a material different from that of the tunnel layer; a block layer formed between the charge layer and the electrode film and made of a dielectric material different from that of the charge layer; and a conductor buried inside the through hole, the charge layer being split for each said electrode film.

According to another aspect of the invention, there is provided a method for manufacturing a semiconductor memory device, including: forming a laminated body in which a plurality of dielectric films and electrode films are alternately laminated on a substrate and have a through hole extending in the lamination direction; selectively forming a charge layer in a region of an inner surface of the through hole corresponding to the electrode film; forming a block layer between the charge layer and the electrode film, the block layer being made of a dielectric material different from that of the charge layer; forming a tunnel layer on an inner side surface of the through hole, the tunnel layer being made of a dielectric material different from that of the charge layer; and burying a conductor inside the through hole.

According to still another aspect of the invention, there is provided a semiconductor memory device including: a semiconductor substrate; a laminated body provided on the semiconductor substrate and including a plurality of electrode layers and a plurality of dielectric layers alternately laminated; a semiconductor layer provided inside a hole formed through the laminated body, the semiconductor layer extending in the lamination direction of the electrode layers and the dielectric layers; and a charge storage layer provided only between the electrode layer and the semiconductor layer and split in the lamination direction.

According to still another aspect of the invention, there is provided a method for manufacturing a semiconductor memory device, including: alternately laminating a plurality of electrode layers and a plurality of dielectric layers on a semiconductor substrate to form a laminated body thereof; forming a hole passing through the laminated body and extending in the lamination direction of the electrode layers and the dielectric layers; setting back an exposed surface of the dielectric layer facing the hole to a first position which is located away from the hole relative to an exposed surface of the electrode layer facing the hole; forming a nitride film by performing thermal nitridation on a protruding portion of the electrode layer protruding toward the hole as a result of the setting back of the dielectric layer; further setting back the dielectric layer from the first position to a second position; and forming an oxide film by performing thermal oxidation on a portion of the electrode layer between the nitride film formed therein and the second position.

Figure 1:
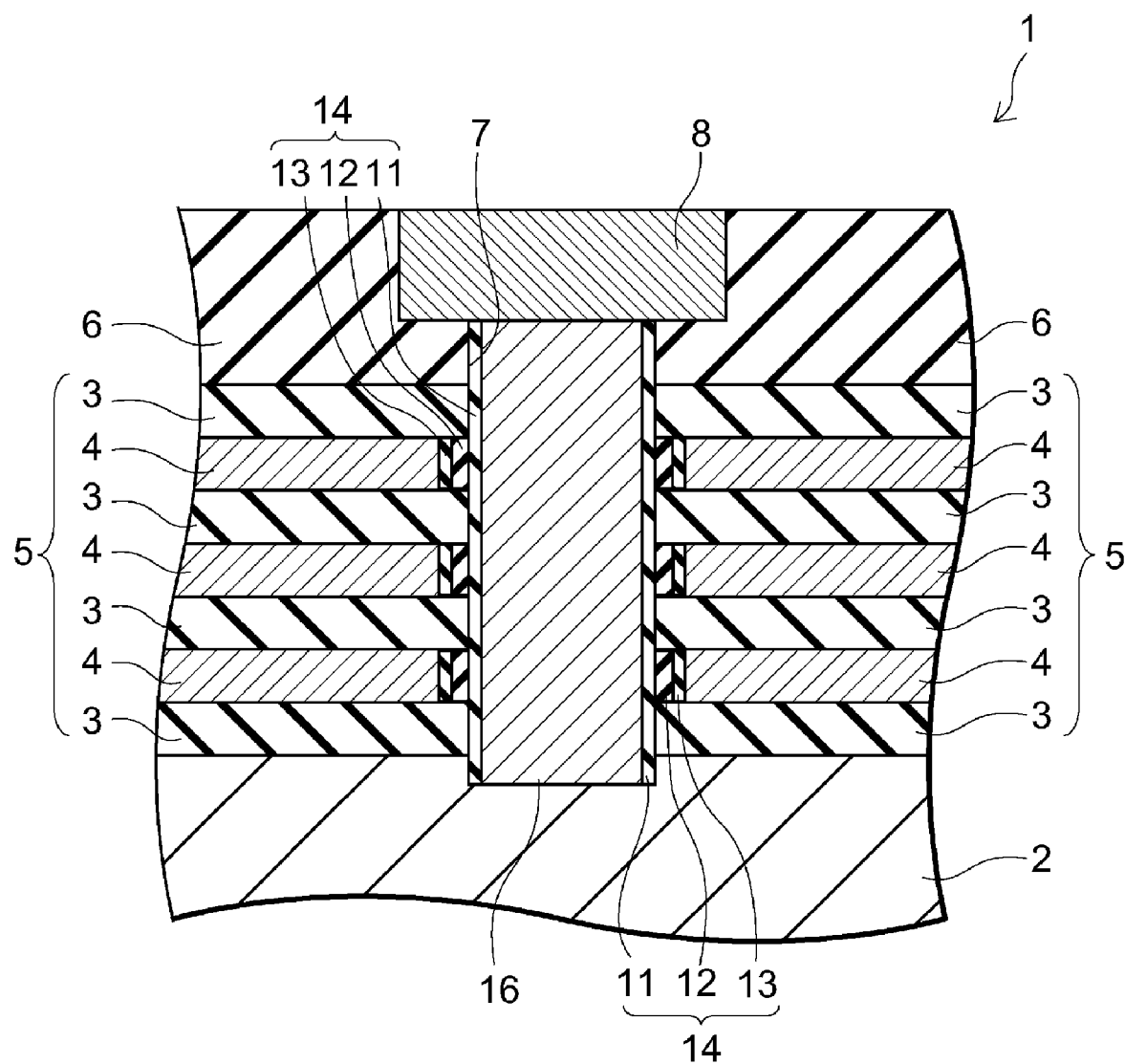
FIG. 1 is a cross-sectional view illustrating a flash memory according to a first embodiment of the invention.

EXPLANATION OF REFERENCE 1, 31, 101 flash memory
2 silicon substrate
3 dielectric film
4 electrode film
5 laminated body
6 upper dielectric film
7 through hole
8 bit line
11 tunnel layer
12, 32 charge layer
13 block layer
14 ONO film
16 conductor
21 resist pattern
21a opening
22 silicon nitride layer
23 silicon oxide layer
41 metal film
61 semiconductor substrate
64 dielectric layer
67 hole
75 first dielectric film
76 charge storage layer
77 second dielectric film
e electron
SP semiconductor layer
WL electrode layer
WLL word line
BL bit line
LSG lower select gate
USG upper select gate

BEST MODE FOR CARRYING OUT THE INVENTION

Embodiments of the invention will now be described with reference to the drawings. At the outset, a first embodiment of the invention is described.

This embodiment relates to a flash memory, which is a kind of nonvolatile semiconductor memory device.

FIG. 1 is a cross-sectional view illustrating the flash memory according to this embodiment.

Figure 2:
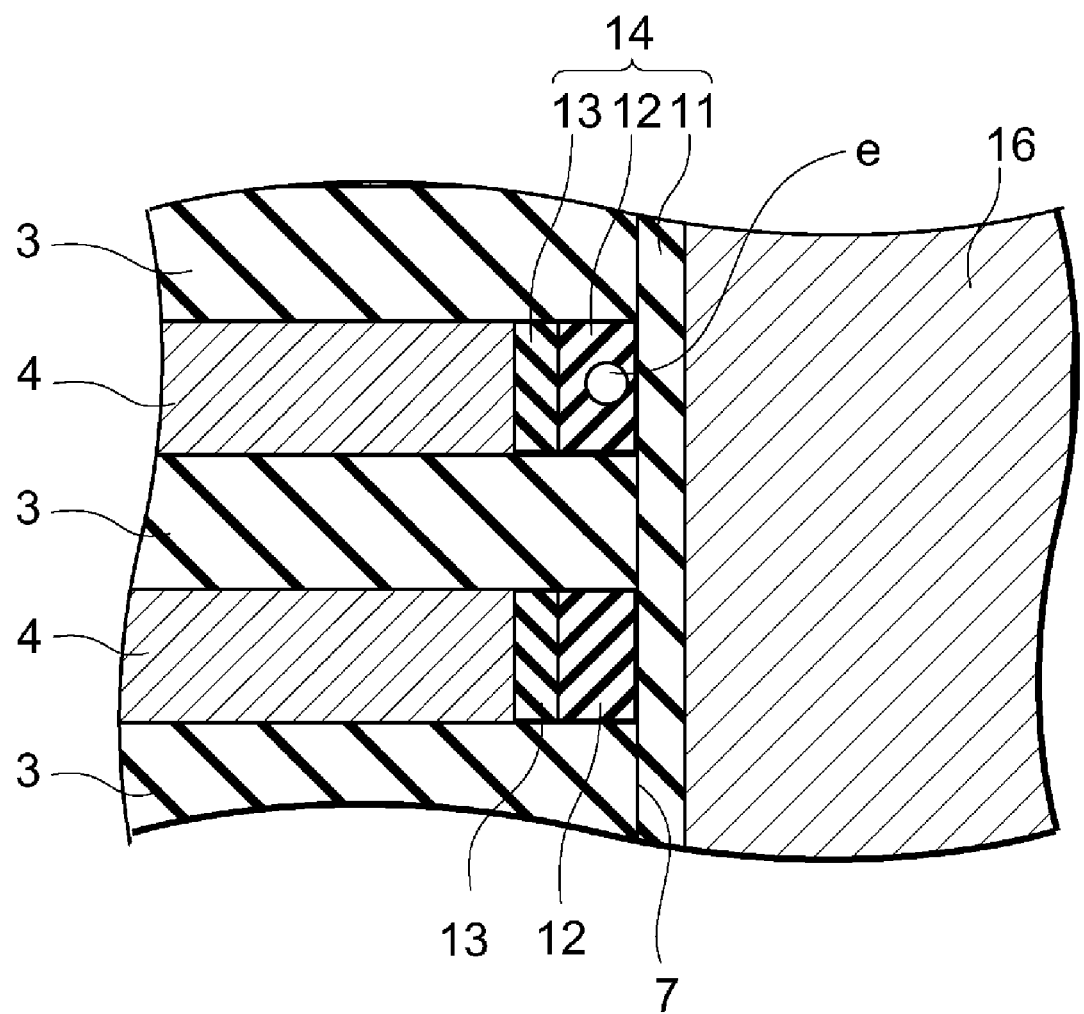
FIG. 2 is a partially enlarged view of FIG. 1.

FIG. 2 is a partially enlarged view of FIG. 1.

As shown in FIG. 1, the flash memory 1 according to this embodiment includes a silicon substrate 2 illustratively made of single crystal silicon. On the silicon substrate 2, a plurality of dielectric films 3 illustratively made of silicon oxide ($SiO_2$) and a plurality of electrode films 4 illustratively made of polycrystalline silicon are alternately laminated to form a laminated body 5. The thickness of the electrode film 4 is illustratively 50 nanometers (nm) or more. The number of electrode films 4 is illustratively 64. It is noted that for convenience of illustration, the laminated body 5 is shown in FIG. 1 with a smaller number of laminations. The electrode films 4 are connected to mutually different upper interconnects through contacts in a portion outside the illustration of FIG. 1. An upper dielectric film 6 is provided on the laminated body 5.

A through hole 7 is formed to pass from the bottom of the upper dielectric film 6 through the laminated body 5 to the upper portion of the silicon substrate 2. The through hole 7 is illustratively shaped like a cylinder, and its central axis extends in the lamination direction of the laminated body 5, that is, in the direction perpendicular to the upper surface of the silicon substrate 2. The diameter of the through hole 7 is illustratively about 90 nanometers. Furthermore, in an upper portion of the upper dielectric film 6 including the directly overlying region of the through hole 7 is provided a bit line 8 illustratively made of polysilicon. The bit line 8 extends in the direction perpendicular to the page of FIG. 1.

As shown in FIGS. 1 and 2, a tunnel layer 11 made of a dielectric material, such as silicon oxide, is formed entirely on the inner side surface of the through hole 7. Furthermore, a charge layer 12 made of a material different from that of the tunnel layer 11, such as silicon nitride (SiN), is formed between the tunnel layer 11 and the electrode film 4. Moreover, a block layer 13 made of a dielectric material different from that of the charge layer 12, such as silicon oxide, is formed between the charge layer 12 and the electrode film 4.

That is, as viewed from inside the through hole 7 toward the electrode film 4, the tunnel layer 11, the charge layer 12, the block layer 13, and the electrode film 4 are arrayed in this order. On the other hand, toward the dielectric film 3, the tunnel layer 11 and the dielectric film 3 are arrayed in this order. Thus, the charge layer 12 is formed only between the tunnel layer 11 and the electrode film 4, and not formed between the tunnel layer 11 and the dielectric film 3. Hence, the charge layer 12 is split for each electrode film 4.

For example, the tunnel layer 11 is in contact with the charge layer 12, and the charge layer 12 is in contact with the block layer 13. Hence, in a region on the inner side surface of the through hole 7 corresponding to the electrode film 4, an ONO film (oxide-nitride-oxide film) 14 is formed from the tunnel layer 11, the charge layer 12, and the block layer 13. The thickness of each of the tunnel layer 11, the charge layer 12, and the block layer 13 is illustratively 3 nanometers or more.

A conductor 16 is buried inside the through hole 7. The conductor 16 is formed from a conductive material. The conductive material includes a semiconductor material as well. The conductor 16 is illustratively formed from polycrystalline silicon, such as an N-type polycrystalline silicon doped with impurity. The conductor 16 is illustratively shaped like a cylinder, and its outer side surface is in contact with the tunnel layer 11. The upper end portion of the conductor 16 is in contact with the bit line 8, and the lower end portion thereof is in contact with the silicon substrate 2. It is noted that an electrode interconnect (not shown) connected to the conductor 16 may be formed in the silicon substrate 2.

Next, the operation and effect of this embodiment are described.

As shown in FIG. 1, in the flash memory 1 according to this embodiment, a prescribed potential is applied to the conductor 16 through the bit line 8 and allows the conductor 16 to serve as a select gate. On the other hand, a mutually independent potential is applied to each electrode film 4 and allows it to serve as a control gate. Thus, each charge layer 12 placed between each electrode film 4 and the conductor 16 is electrically charged and discharged to serve as a memory cell.

Furthermore, as shown in FIG. 2, in this embodiment, the charge layer 12 is split for each electrode film 4. Hence, the electron e stored in the charge layer 12 is confined in that charge layer 12 and less likely to leak outside that charge layer 12. Thus, data erasure due to diffusion of electrons is less likely to occur. Consequently, the flash memory 1 according to this embodiment has high reliability in retaining data for a long period of time.

Next, a comparative example of this embodiment is described.

Figure 3:
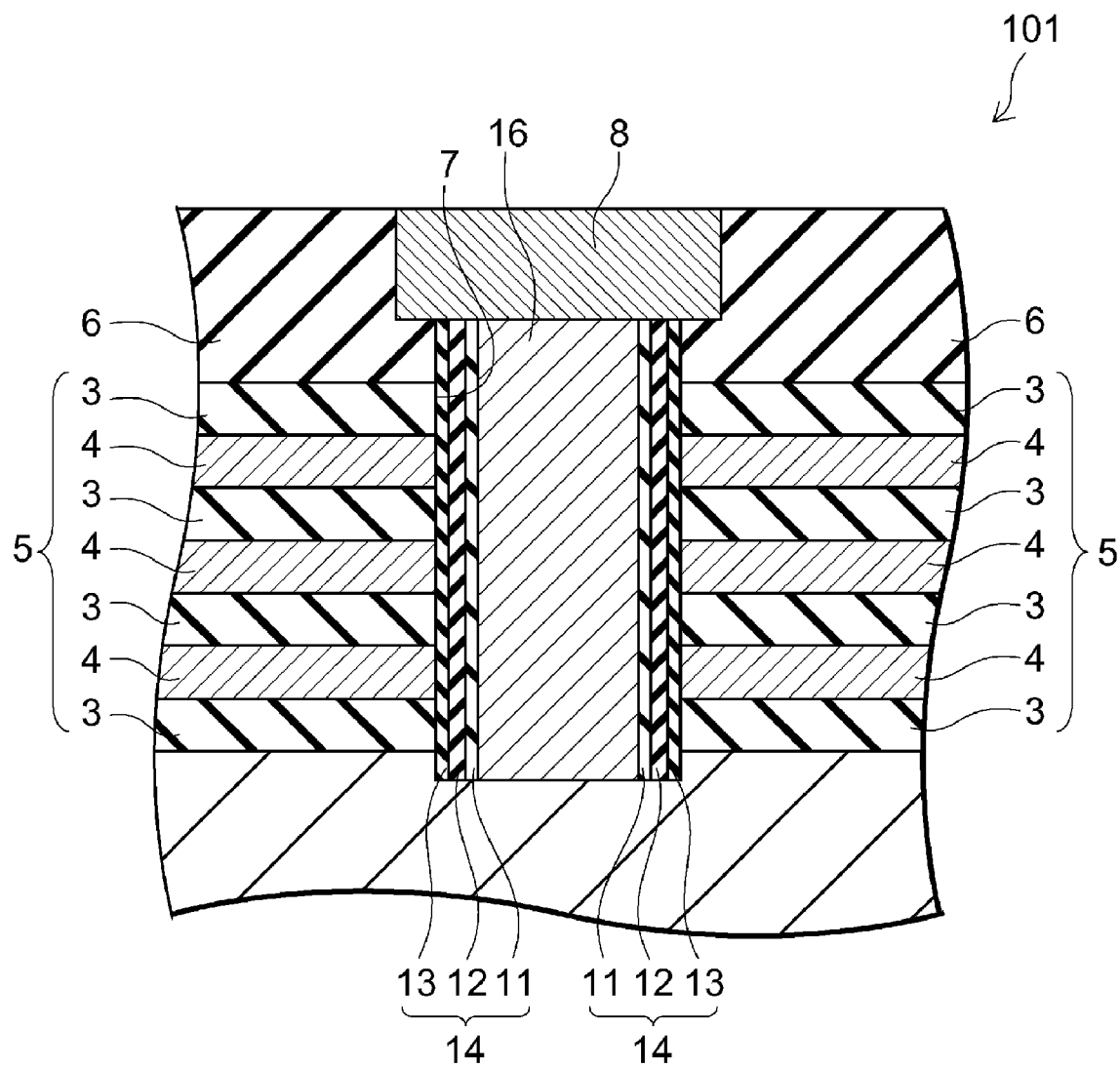
FIG. 3 is a cross-sectional view illustrating a flash memory according to a comparative example of the first embodiment.

FIG. 3 is a cross-sectional view illustrating the flash memory according to the comparative example of this embodiment.

Figure 4:
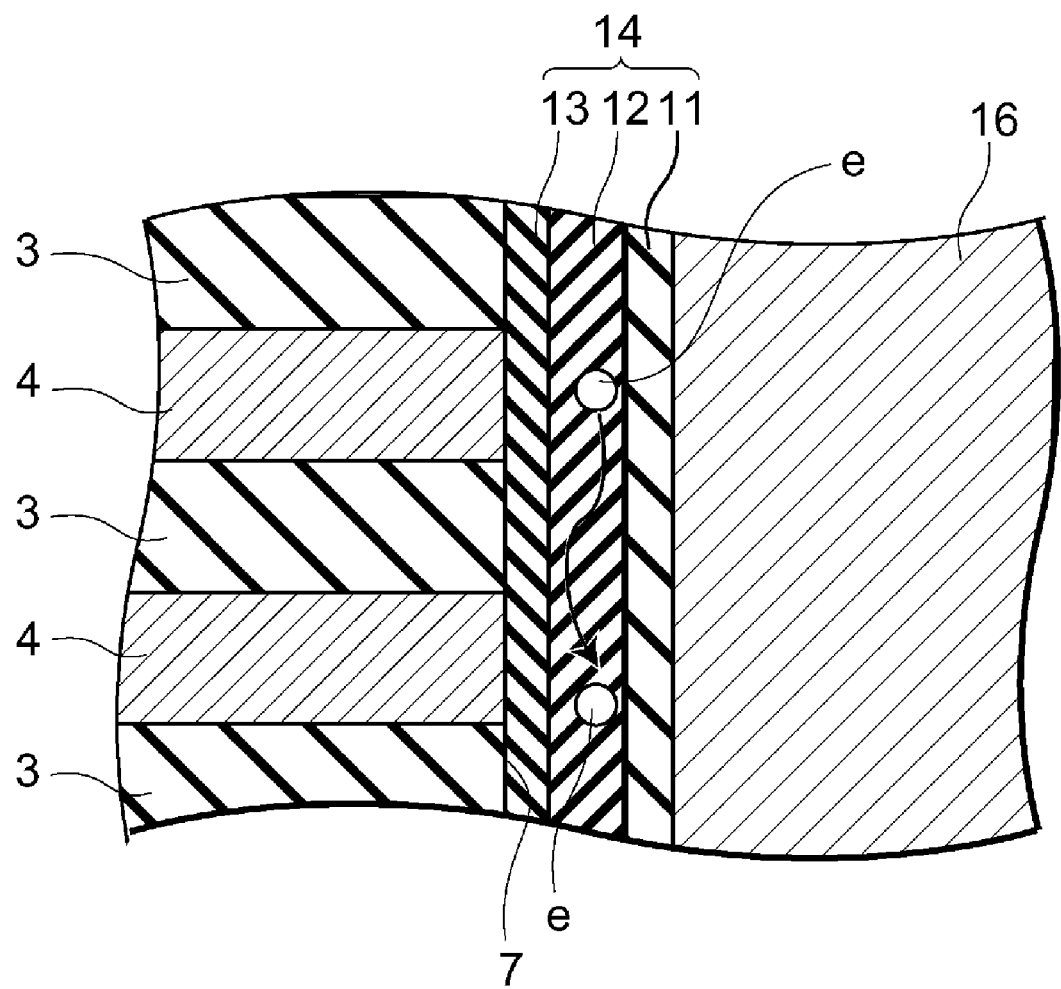
FIG. 4 is a partially enlarged view of FIG. 3.

FIG. 4 is a partially enlarged view of FIG. 3.

As shown in FIG. 3, in the flash memory 101 according to the comparative example, the ONO film 14 made of the tunnel layer 11, the charge layer 12, and the block layer 13 is formed entirely on the inner side surface of the through hole 7. That is, the charge layer 12 is not split for each electrode film 4, but continuously formed throughout the inner side surface of the through hole 7. The configuration in this comparative example other than the foregoing is the same as that in the above first embodiment.

As shown in FIG. 4, in the flash memory 101 according to this comparative example, the charge layer 12 is continuously formed so that the regions between the respective electrode films 4 and the conductor 16 communicate with each other. Hence, the electron e stored in the portion of the charge layer 12 corresponding to one electrode film 4 leaks from this portion over time and migrates to the portion corresponding to another electrode film 4, for example. This leads to low reliability in retaining data for a long period of time.

Next, a second embodiment of the invention is described.

This embodiment relates to a method for manufacturing the flash memory according to the above first embodiment.

FIGS. 5A-5C and 6A-6C are process cross-sectional views illustrating the method for manufacturing a flash memory according to this embodiment.

Figure 5A:
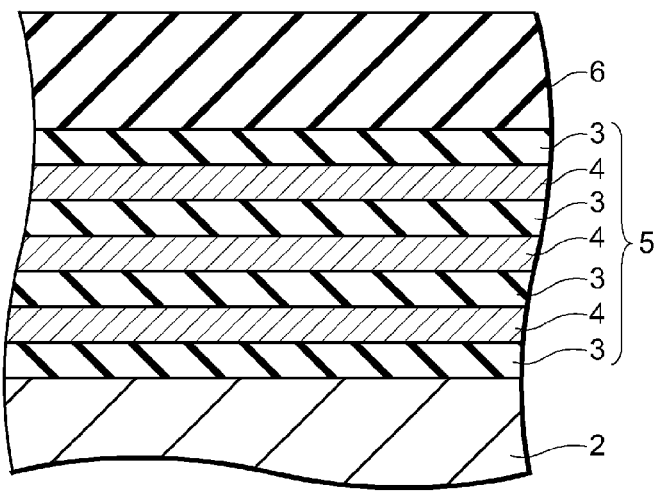
FIGS. 5A-5C are process cross-sectional views illustrating a method for manufacturing a flash memory according to a second embodiment of the invention.

First, as shown in FIG. 5A, a silicon substrate 2 is prepared. Then, a dielectric film 3 is formed by depositing silicon oxide on the silicon substrate 2 illustratively by CVD (chemical vapor deposition). Next, an electrode film 4 is formed by depositing polycrystalline silicon. Subsequently, likewise, dielectric films 3 and electrode films 4 are alternately deposited. Here, the thickness of the electrode film 4 is illustratively 50 nanometers or more. Thus, a laminated body 5 is formed in which a plurality of dielectric films and electrode films are alternately laminated. Subsequently, an upper dielectric film 6 is formed on the laminated body 5.

Figure 5B:
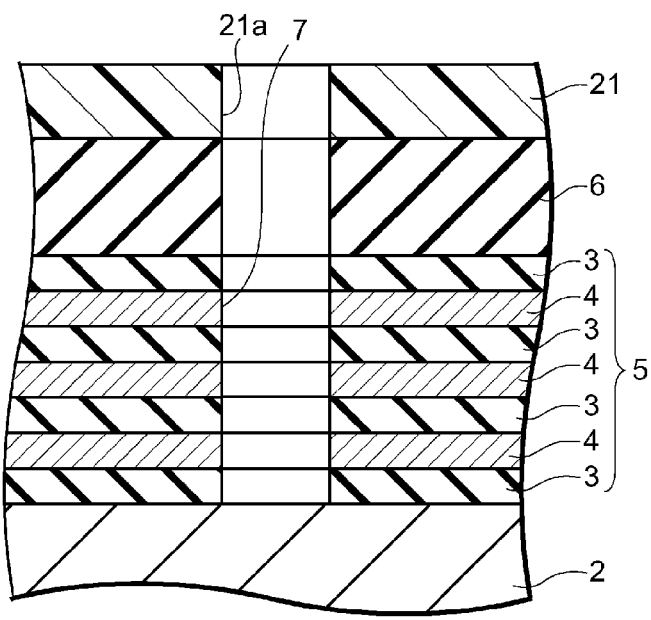

Next, as shown in FIG. 5B, a resist film is formed on the upper dielectric film 6, and patterned by photolithography. Thus, a resist pattern 21 having an opening 21a is formed. The opening 21a is illustratively shaped like a circle, and its diameter is illustratively 90 nm. Next, this resist pattern 21 is used as a mask to perform etching. Thus, the portion of the upper dielectric film 6 and the laminated body 5 corresponding to the directly underlying region of the opening 21a is removed to form a through hole 7 reaching the silicon substrate 2. Subsequently, the resist pattern 21 is removed. This results in the laminated body 5 in which a plurality of dielectric films 3 and electrode films 4 are alternately laminated on the silicon substrate 2, and the through hole 7 extending in the lamination direction is formed therein. It is noted that as the etching mask, a dielectric film may be used instead of the resist pattern 21.

Figure 5C:
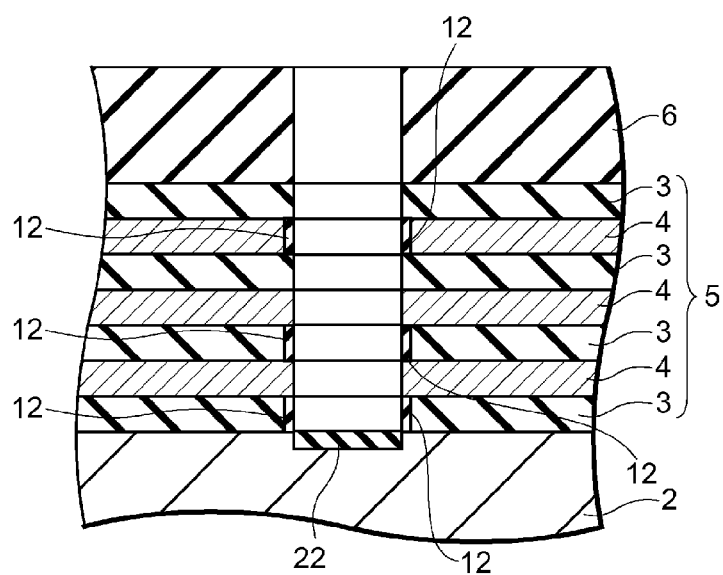

Next, as shown in FIG. 5C, a selective nitridation process is performed to selectively form a silicon nitride layer only in the surface of the electrode film 4 made of polycrystalline silicon. This selective nitridation process is performed illustratively by exposure to nitrogen gas at a pressure of 0.5 Torr (=67 Pa) or more. Thus, a charge layer 12 is selectively formed in the region of the inner surface of the through hole 7 corresponding to the electrode film 4. The thickness of the charge layer 12 is illustratively 3 nanometers or more. It is noted that at this time, the silicon nitride layer 22 is formed also in the upper surface of the silicon substrate 2 exposed at the bottom of the through hole 7.

Figure 6A:
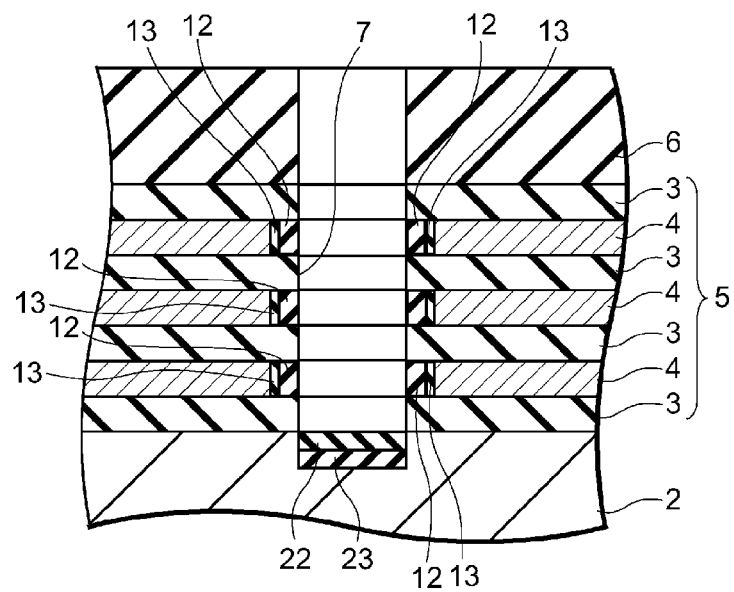
FIGS. 6A-6C are process cross-sectional views illustrating a method for manufacturing a flash memory according to a second embodiment of the invention.

Next, as shown in FIG. 6A, a high-pressure oxidation process is performed to oxidize the portion of the electrode film 4 being in contact with the charge layer 12. This high-pressure oxidation process is performed illustratively by exposure to steam ($H_2O$) at a pressure of 2 atmospheres (=203 kPa) or more. Thus, oxygen is diffused in the charge layer 12, and a block layer 13 made of silicon oxide is formed between the charge layer 12 and the electrode film 4. The thickness of the block layer 13 is illustratively 3 nanometers or more. It is noted that at this time, no silicon oxide layer is newly formed in the surface of the dielectric film 3. On the other hand, a silicon oxide layer 23 is formed directly below the silicon nitride layer 22 formed at the bottom of the through hole 7.

Figure 6B:
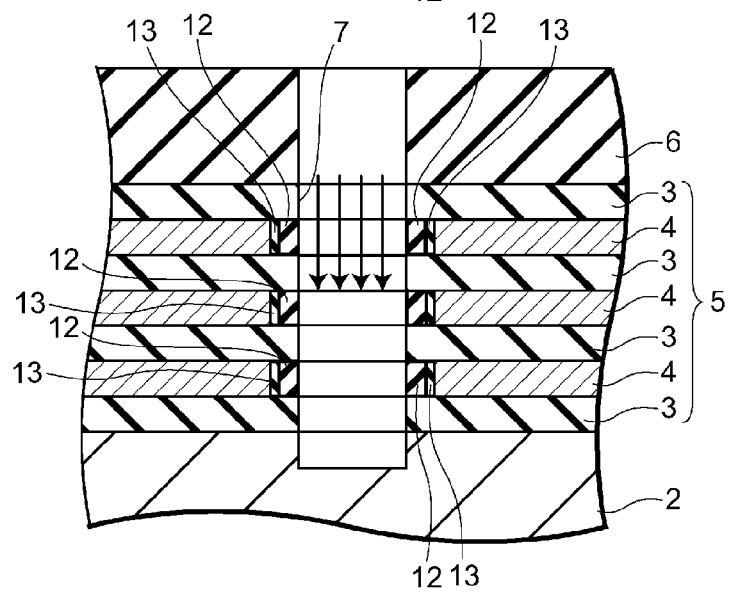

Next, as shown in FIG. 6B, anisotropic etching such as RIE (reactive ion etching) is applied to remove the silicon nitride layer 22 and the silicon oxide layer 23 formed in the upper portion of the silicon substrate 2 at the bottom of the through hole 7.

Figure 6C:
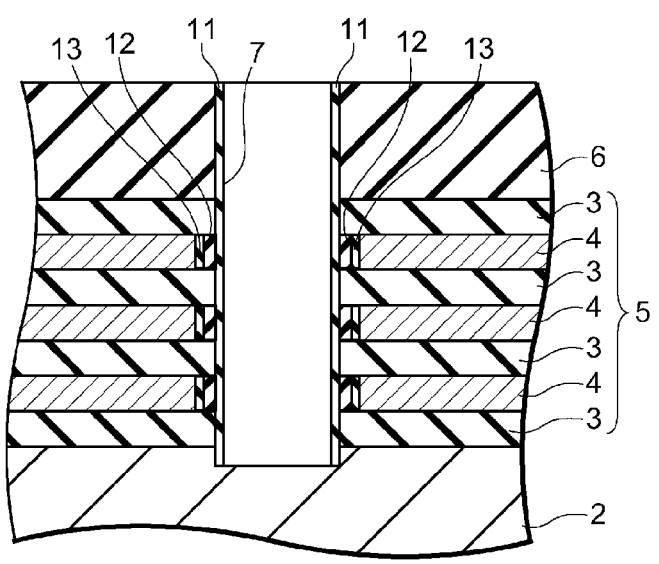

Next, as shown in FIG. 6C, an oxidation process is applied to form a silicon oxide layer entirely on the inner surface of the through hole 7. Then, anisotropic etching such as RIE is performed to remove the portion of this silicon oxide layer that is formed on the bottom of the through hole 7. Thus, a tunnel layer 11 made of silicon oxide is formed entirely on the inner side surface of the through hole 7. It is noted that RIE in the process shown in FIG. 6B may be omitted, and the silicon nitride layer 22 and the silicon oxide layer 23 may also be removed simultaneously in this process.

Next, as shown in FIG. 1, a conductor 16 is buried inside the through hole 7 illustratively by burying polycrystalline silicon therein. Subsequently, a bit line 8 is formed in the upper portion of the upper dielectric film 6 so as to be connected to the conductor 16. Thus, the flash memory 1 according to the first embodiment is manufactured.

Next, the effect of this embodiment is described.

As described above, in this embodiment, the charge layer 12 is formed by selective nitridation in the process shown in FIG. 5C, and the block layer 13 is formed by high-pressure oxidation in the process shown in FIG. 6A. Thus, in this embodiment, the charge layer 12 and the block layer 13 are formed not by the film formation technique such as CVD, but by nitridation/oxidation. Hence, the block layer 13 and the charge layer 12 can be formed only on the surface of the electrode film 4 serving as a control gate electrode, and not on the surface of the dielectric film 3. Consequently, the charge layer 12 can be formed separately for each electrode film 4. Furthermore, according to this embodiment, the diameter of the through hole 7 is not decreased by the formation of the block layer 13 and the charge layer 12. Hence, by that amount, a margin is provided in the through hole 7.

In contrast, in manufacturing the flash memory 101 according to the comparative example shown in FIGS. 3 and 4, after the through hole 7 is formed, the block layer 13, the charge layer 12, and the tunnel layer 11 are formed on the inner side surface of the through hole 7 by CVD and the like. Hence, the charge layer 12 will be continuously formed, causing migration of electrons between memory cells.

Next, a third embodiment of the invention is described.

This embodiment is an example in which the charge layer is formed from a silicon-containing metal oxide.

Figure 7:
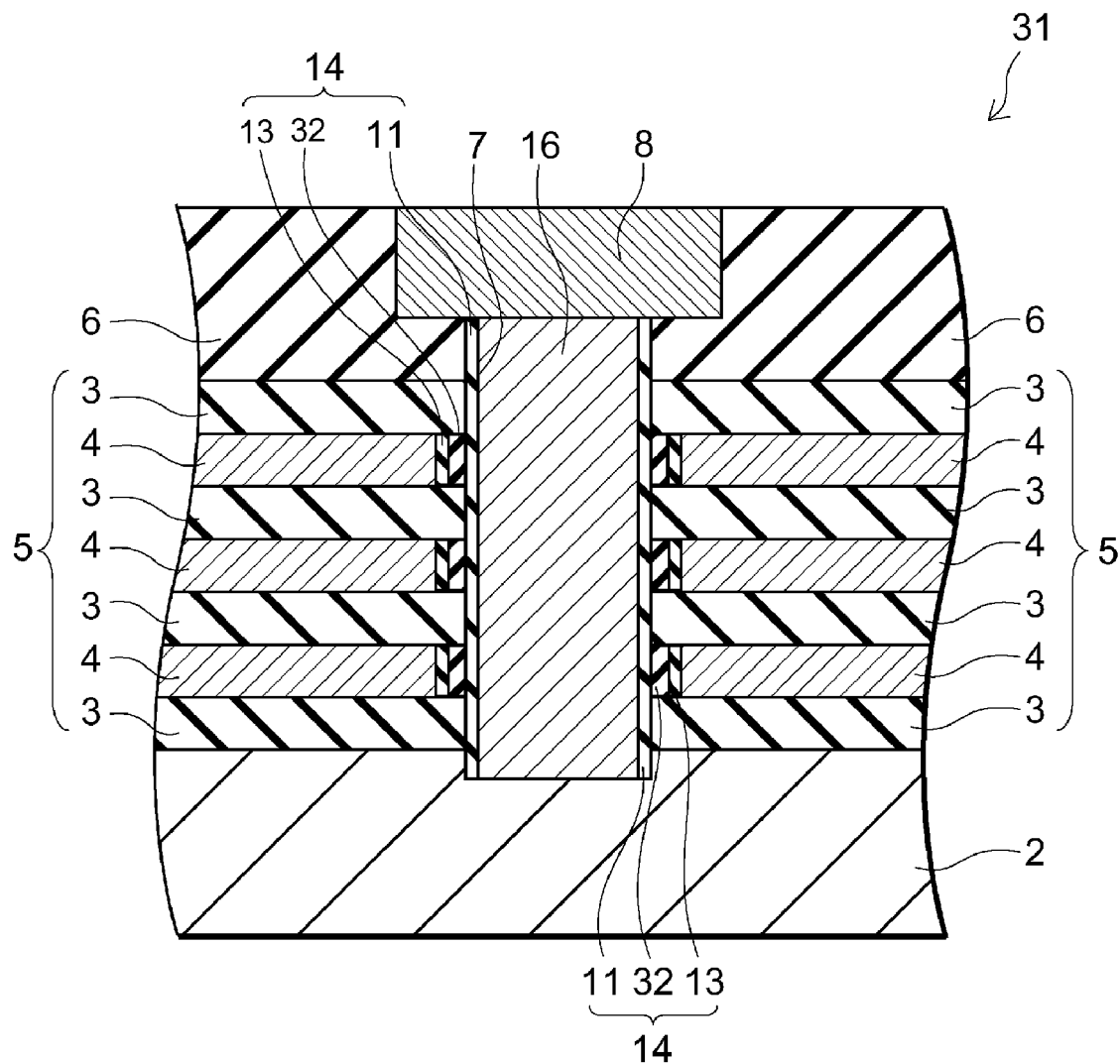
FIG. 7 is a cross-sectional view illustrating a flash memory according to a third embodiment of the invention.

FIG. 7 is a cross-sectional view illustrating the flash memory according to this embodiment.

As shown in FIG. 7, the flash memory 31 according to this embodiment is different from the flash memory 1 according to the above first embodiment (see FIG. 1) in that the charge layer 12 made of silicon nitride (see FIG. 1) is replaced by a charge layer 32 made of a silicon-containing metal oxide. The charge layer 32 is illustratively formed from a material made by silicidation and oxidation of a metal such as hafnium (Hf), zirconium (Zr), tantalum (Ta), titanium (Ti), or tungsten (W). In the flash memory 31, like the above first embodiment, the charge layer 32 is split for each electrode film 4. The configuration, operation, and effect of the flash memory according to this embodiment other than the foregoing are the same as those of the above first embodiment.

Next, a fourth embodiment of the invention is described.

This embodiment relates to a method for manufacturing the flash memory according to the above third embodiment.

Figure 8A:
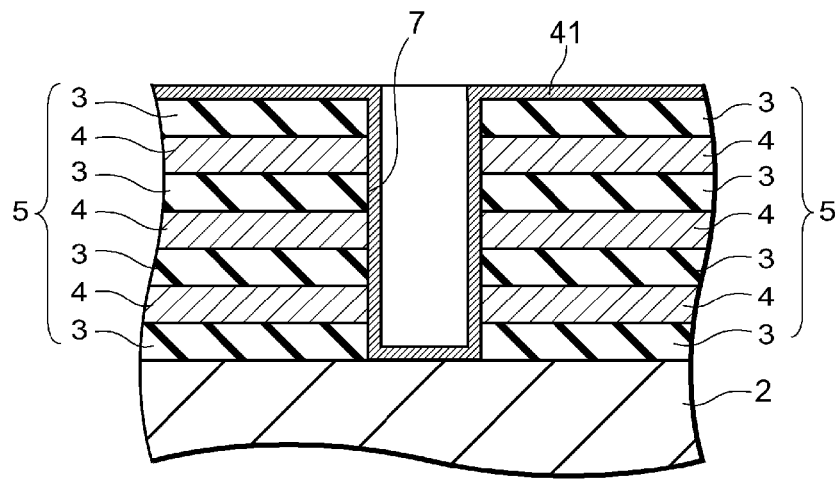
FIGS. 8A-8C are process cross-sectional views illustrating a method for manufacturing a flash memory according to a fourth embodiment of the invention.
Figure 8B:
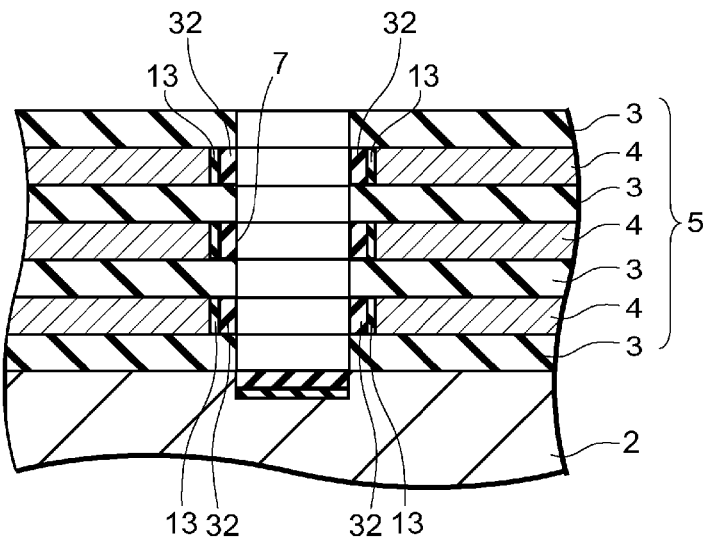
Figure 8C:
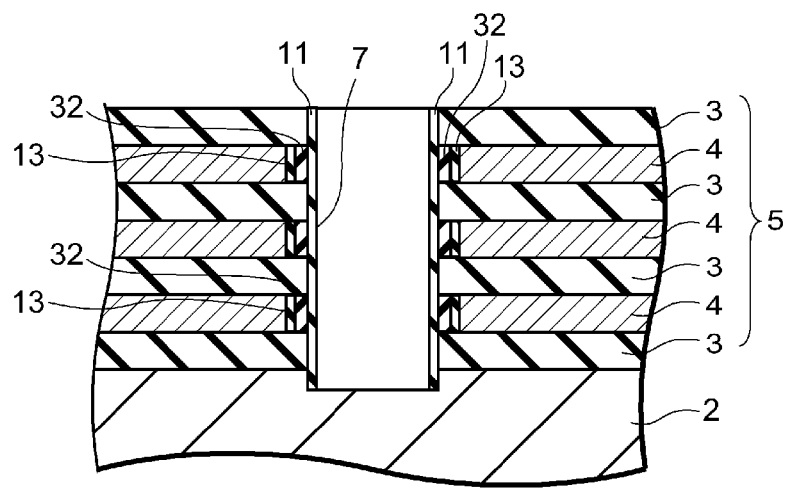

FIGS. 8A-8C are process cross-sectional views illustrating the method for manufacturing a flash memory according to this embodiment. It is noted that in FIG. 8, the upper dielectric film 6 (see FIG. 1) is not shown.

First, as shown in FIG. 5A, a laminated body 5 and an upper dielectric film 6 are formed on a silicon substrate 2. Next, as shown in FIG. 5B, a through hole 7 is formed in the laminated body 5 and the upper dielectric film 6. The processes thus far are the same as those in the above second embodiment.

Next, as shown in FIG. 8A, a metal film 41 is entirely formed by depositing a metal such as hafnium (Hf), zirconium (Zr), tantalum (Ta), titanium (Ti), or tungsten (W) by CVD and the like. Thus, the metal film 41 is formed on the entire surface including the inner surface of the through hole 7. Subsequently, an annealing process is performed to cause the metal forming the metal film 41 to react with silicon forming the electrode film 4 so that the portion of the metal film 41 being in contact with the electrode film 4 is silicidized. It is noted that at this time, the portion of the metal film 41 being in contact with the silicon substrate 21 is also silicidized.

Next, the non-silicidized portion of the metal film 41 is dissolved away illustratively by exposing the inner surface of the through hole 7 to an alkaline chemical. At this time, the silicidized portion of the metal film 41 remains without dissolution. Thus, the silicidized metal film 41 can be selectively left only on the region on the inner side surface of the through hole 7 corresponding to the electrode film 4.

Next, as shown in FIG. 8B, an oxidation process is applied to oxidize the silicidized metal film 41. Thus, a charge layer 32 made of a silicon-containing metal oxide is formed. At this time, oxygen is diffused in the charge layer 32, and hence a block layer 13 made of silicon oxide is formed at the interface between the charge layer 32 and the electrode film 4. Thus, the charge layer 32 and the block layer 13 can be formed only in the region on the inner side surface of the through hole 7 corresponding to the electrode film 4. Subsequently, anisotropic etching such as RIE is performed to remove the silicon oxide layer and the metal oxide layer formed at the bottom of the through hole 7.

Next, as shown in FIG. 8C, an oxidation process is applied again to form a silicon oxide layer entirely on the inner surface of the through hole 7. Then, anisotropic etching such as RIE is performed to remove the portion of this silicon oxide layer that is formed on the bottom of the through hole 7. Thus, a tunnel layer 11 made of silicon oxide is formed entirely on the inner side surface of the through hole 7.

Subsequently, like the above second embodiment, a conductor 16 is buried in the through hole 7, and a bit line 8 is formed in the upper portion of the upper dielectric film 6. Thus, the flash memory according to this embodiment is manufactured. The manufacturing method in this embodiment other than the foregoing is the same as that in the above second embodiment. Thus, according to this embodiment, a flash memory 31 can be manufactured in which the charge layer is formed from a silicon-containing metal oxide layer.

Next, a fifth embodiment of the invention is described.

Figure 9:
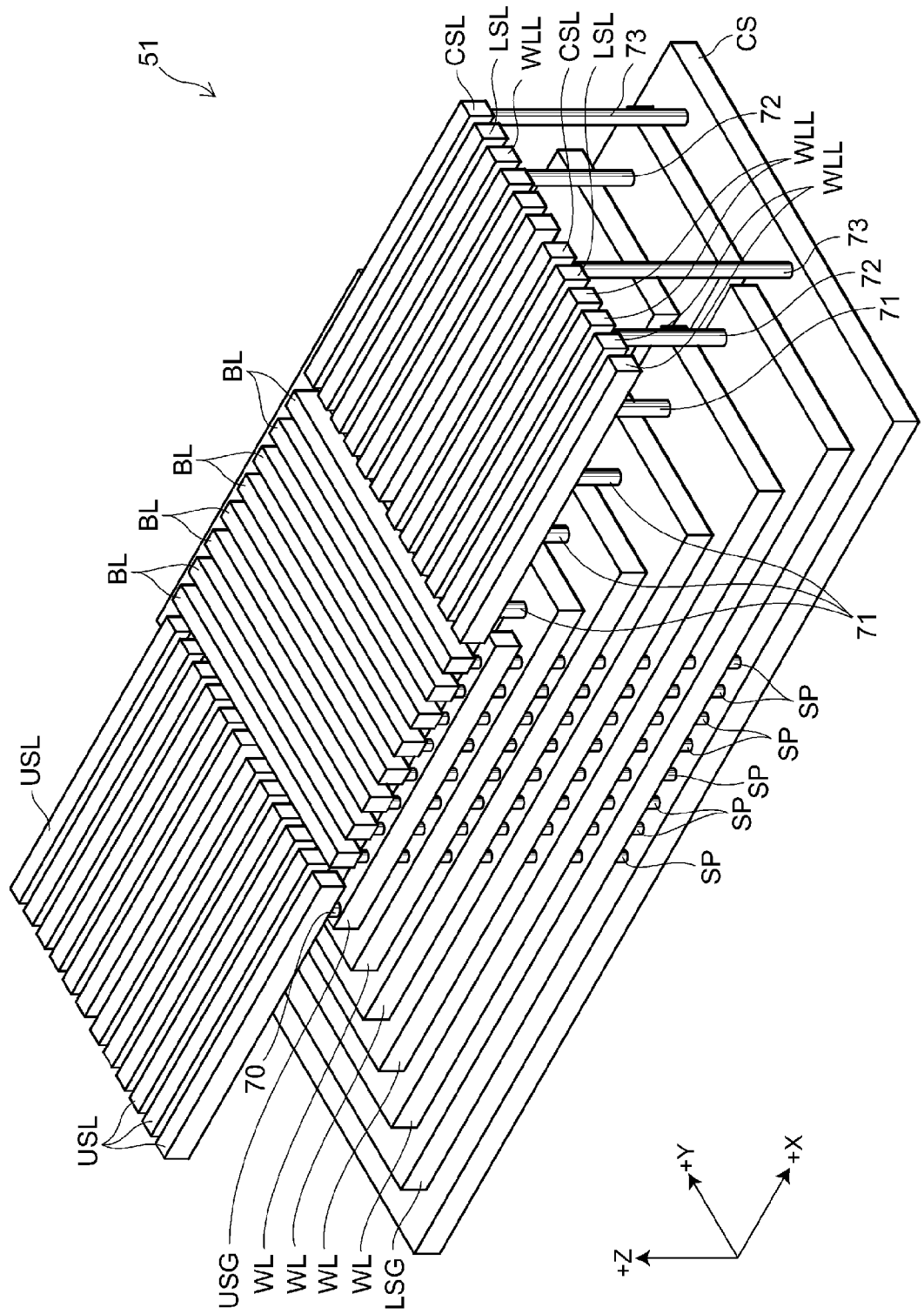
FIG. 9 is a schematic perspective view illustrating a semiconductor memory device according to a fifth embodiment of the invention.

FIG. 9 is a schematic perspective view illustrating a semiconductor memory device according to this embodiment.

Figure 10:
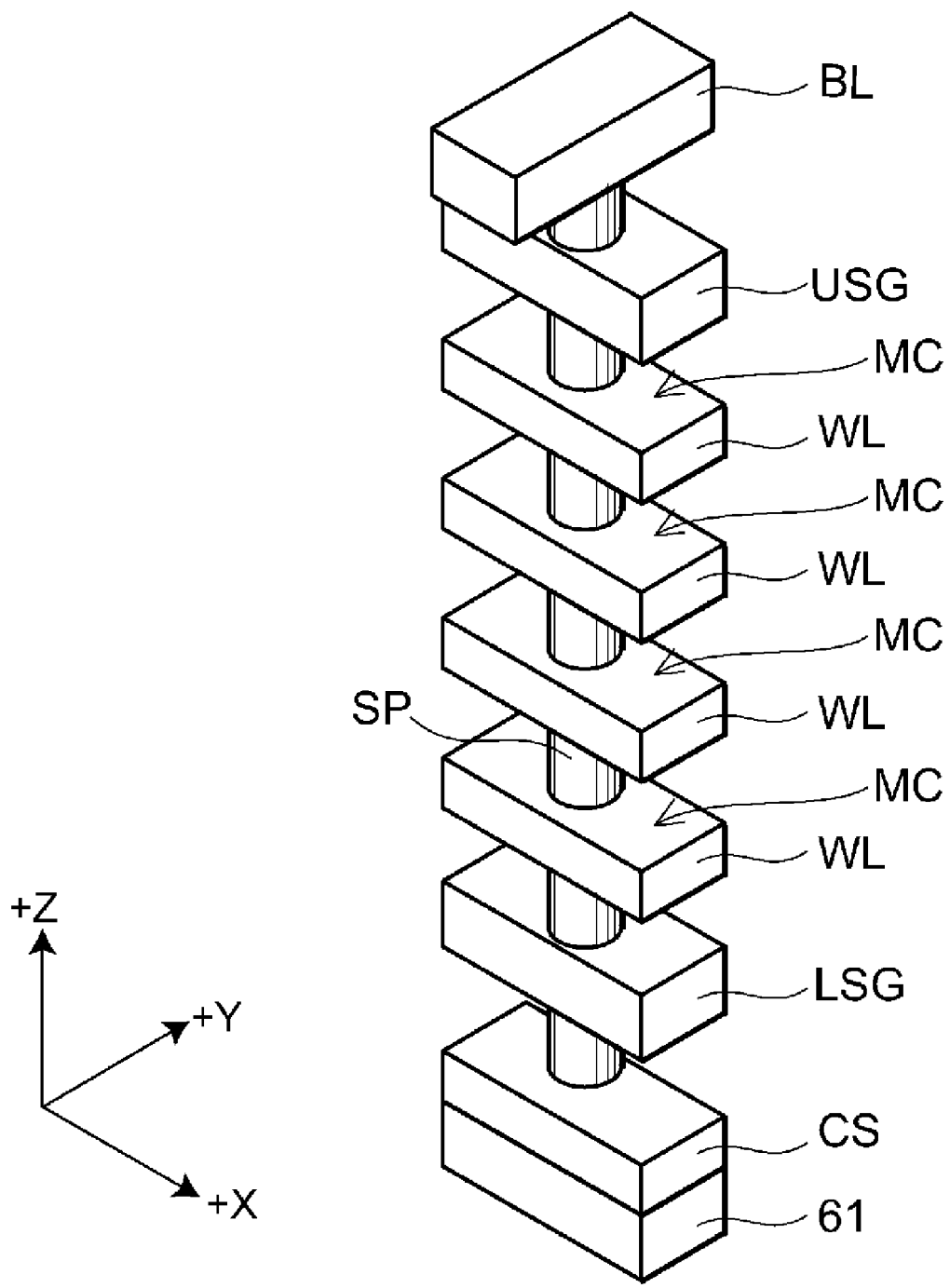
FIG. 10 is a schematic perspective view of one memory string in the semiconductor memory device shown in FIG. 9.

FIG. 10 is a schematic perspective view of one memory string in the semiconductor memory device.

Figure 11:
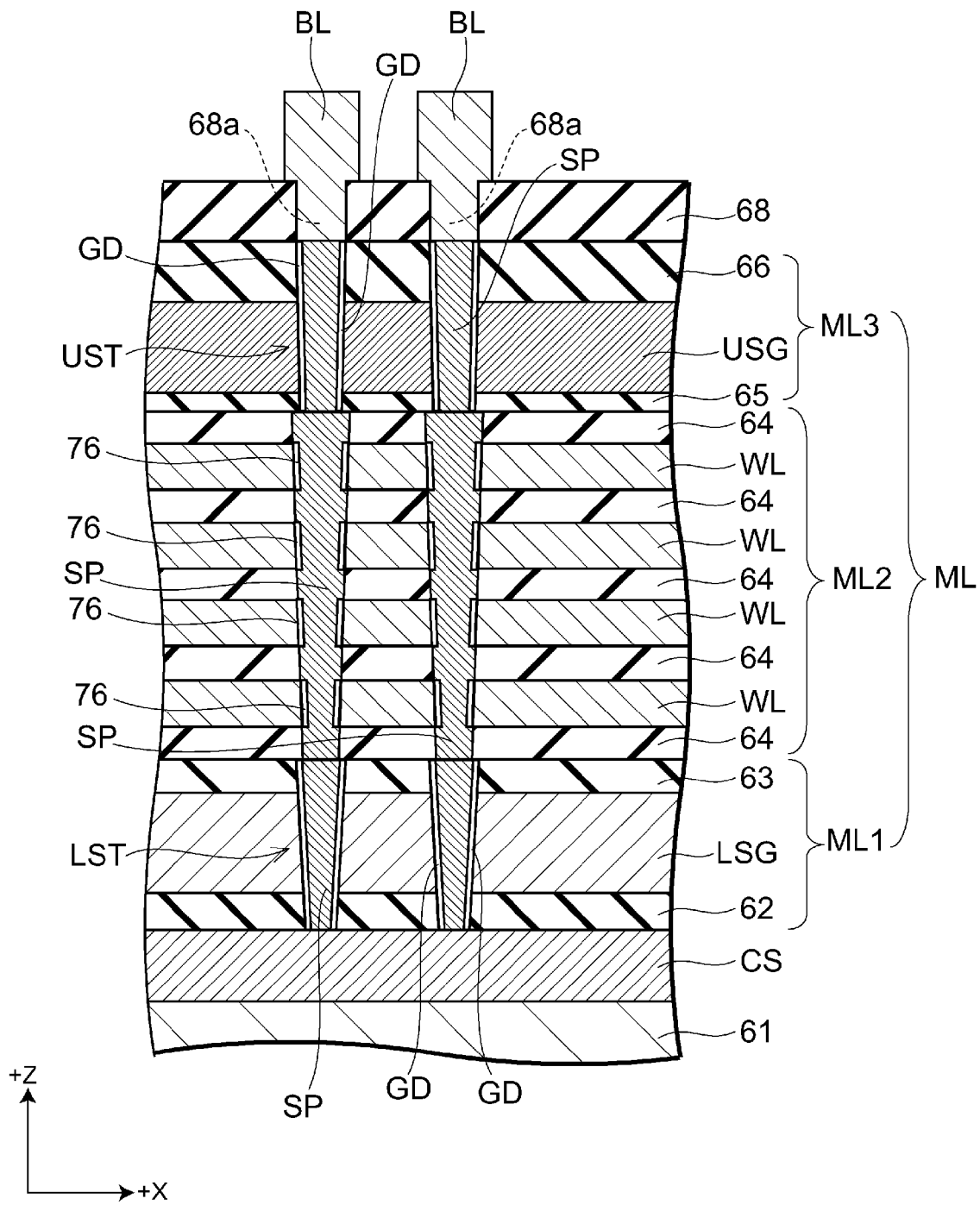
FIG. 11 is a schematic cross-sectional view of the main part in the XZ direction in FIG. 9.

FIG. 11 is a schematic cross-sectional view of the main part in the XZ direction in FIG. 9.

Figure 12:
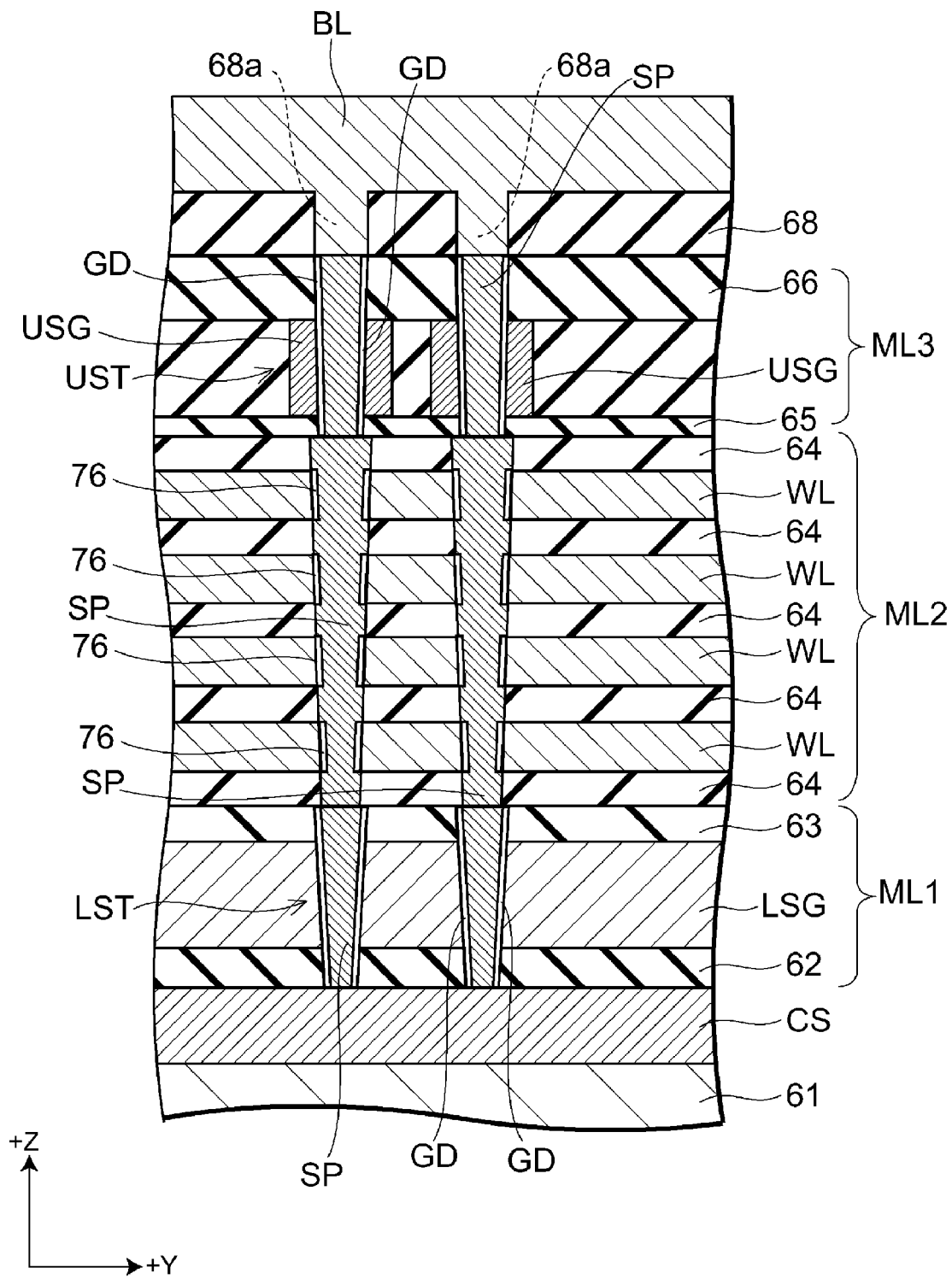
FIG. 12 is a schematic cross-sectional view of the main part in the YZ direction in FIG. 9.

FIG. 12 is a schematic cross-sectional view of the main part in the YZ direction in FIG. 9.

Figure 13:
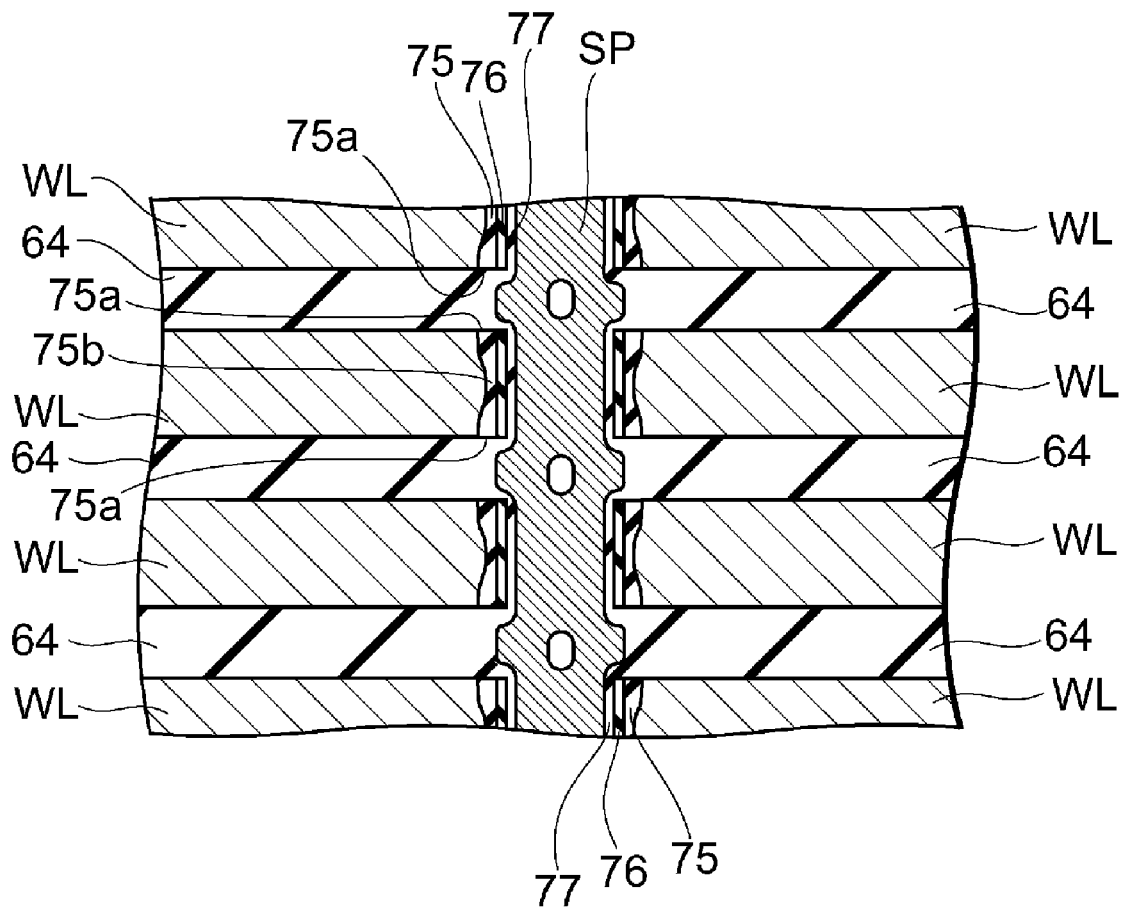
FIG. 13 is an enlarged cross-sectional view of a memory cell in the semiconductor memory device shown in FIG. 9.

FIG. 13 is an enlarged cross-sectional view of a memory cell provided in the laminated body of electrode layers and dielectric layers in the semiconductor memory device.

It is noted that in FIGS. 9 and 10, for clarity of illustration, only the conductive portions are shown, and the insulative portions are not shown.

The semiconductor memory device according to this embodiment has a structure in which a semiconductor layer, a dielectric layer, an electrode layer, and an interconnect are formed on a semiconductor substrate. It is noted that in this embodiment, the semiconductor is illustratively silicon, but other semiconductors may be used.

As shown in FIGS. 11 and 12, a cell source CS is provided on a silicon substrate 61. The cell source CS is illustratively a silicon layer, which is doped with impurity at a relatively high concentration for resistance reduction. A dielectric layer 62 is provided on the cell source CS, a lower select gate LSG is provided thereon, and a dielectric layer 62 is provided thereon. The dielectric layer 62, 63 is illustratively a silicon oxide layer, and the lower select gate LSG is illustratively a silicon layer. The dielectric layer 62, the lower select gate LSG, and the dielectric layer 63 constitute a laminated body ML1. It is noted that the dielectric layer 63 is not necessarily needed.

On the laminated body ML1 is provided a laminated body ML2 in which a plurality of dielectric layers 64 illustratively made of silicon oxide and a plurality of electrode layers WL illustratively made of amorphous or polycrystalline silicon are alternatively laminated.

The electrode layer WL serves as a word line. The dielectric layer 64 is provided above, below, and between the electrode layers WL, and serves as an interlayer dielectric layer for insulating the electrode layers WL from each other. If the number of electrode layers WL is denoted by n (where n is a natural number), the number of dielectric layers 64 is n+1. Although the number, n, of electrode layers WL is arbitrary, the case of n=4 is illustrated in this embodiment.

A dielectric layer 65 is provided on the laminated body ML2, and an upper select gate USG is provided thereon, and a dielectric layer 66 is provided thereon. The dielectric layer 65, 66 is illustratively a silicon oxide layer, and the upper select gate USG is illustratively a silicon layer. The dielectric layer 65, the upper select gate USG, and the dielectric layer 66 constitute a laminated body ML3. It is noted that the dielectric layer 66 is not necessarily needed.

In the following, in this embodiment, for convenience of description, an XYZ orthogonal coordinate system is introduced. In this coordinate system, the two directions parallel to the upper surface (major surface) of the silicon substrate 61 and orthogonal to each other are referred to as the X and Y direction, and the direction orthogonal to both the X and Y direction, that is, the lamination direction of the dielectric layers 64 and the electrode layers WL, is referred to as the Z direction.

The laminated body ML1, the laminated body ML2, and the laminated body ML3 (hereinafter also collectively referred to as "laminated body ML") are divided into a plurality of blocks along the Y direction.

The upper select gate USG is formed by dividing one plate-like conductive layer (illustratively, a silicon layer) along the Y direction into a plurality of interconnecting conductive members extending in the X direction.

The electrode layer WL and the lower select gate LSG are plate-like conductive layers parallel to the XY plane. As an alternative configuration, the lower select gate LSG may be divided into a plurality of parts like the upper select gate USG. The cell source CS is a single plate-like conductive layer parallel to the XY plane so as to connect the directly underlying regions of the plurality of blocks of the laminated body ML.

The laminated body ML includes a plurality of through holes extending in the lamination direction (Z direction) throughout the laminated body ML. The plurality of through holes are arrayed in a matrix configuration illustratively along the X and Y direction.

A silicon pillar SP is buried as a columnar semiconductor layer inside each through hole. The silicon pillar SP is formed from polycrystalline silicon or amorphous silicon. The silicon pillar SP is shaped like a column extending in the Z direction, and illustratively shaped like a cylinder. Furthermore, the silicon pillar SP is provided throughout the lamination direction of the laminated body ML, and its lower end portion is connected to the cell source CS.

A dielectric layer 68 (see FIGS. 11 and 12) is provided on the laminated body ML3, and a plurality of bit lines BL extending in the Y direction are provided on the dielectric layer 68. The bit line BL is illustratively formed from a metal material. It is noted that the term "metal" used herein includes alloys as well as pure metals.

The bit lines BL are arrayed so as to pass through the directly overlying region of the respective silicon pillars SP arrayed along the Y direction, and are connected to the upper end portion of the silicon pillars SP through via holes 68a formed in the dielectric layer 68. That is, the silicon pillar SP is connected to a different bit line BL for each row extending in the Y direction. Each silicon pillar SP is connected between the bit line BL and the cell source CS.

The upper select gate USG is connected through a via 70 to an upper select gate interconnect USL illustratively formed from a metal material.

For each block of the laminated body ML, a plurality of word lines WLL, one lower select gate interconnect LSL, and one cell source interconnect CSL are provided. The word line WLL, the lower select gate interconnect LSL, and the cell source interconnect CSL are each illustratively formed from a metal material.

The number of word lines WLL corresponding to one block of the laminated body ML is equal to the number of electrode layers WL, and each word line WLL is connected to one electrode layer WL through a via 71. The lower select gate interconnect LSL is connected to the lower select gate LSG through a via 72, and the cell source interconnect CSL is connected to the cell source CS through a contact 73.

The interconnects are insulated from each other by an interlayer dielectric film, not shown.

As shown in FIG. 13, a first dielectric film 75, a charge storage layer 76, and a second dielectric film 77 are each tubularly formed on the inner peripheral wall of the hole formed in the laminated body ML2 made of the laminated structure of the electrode layers WL and the dielectric layers 64. The silicon pillar SP is buried inside the second dielectric film 77, and the second dielectric film 77 is in contact with the silicon pillar SP.

The first dielectric film 75 is provided in contact with the electrode layer WL, and the charge storage layer 76 is provided between the first dielectric film 75 and the second dielectric film 77. The first dielectric film 75 and the charge storage layer 76 are provided only between the electrode layer WL and the silicon pillar SP, and not provided between the dielectric layer 64 and the silicon pillar SP. That is, the first dielectric film 75 and the charge storage layer 76 are split in the lamination direction of the dielectric layers 64 and the electrode layers WL.

The silicon pillar SP provided in the laminated body ML2 serves as a channel, the electrode layer WL serves as a control gate, and the charge storage layer 76 serves as a data storage layer for storing charge injected from the silicon pillar SP. That is, at the intersection between the silicon pillar SP and each electrode layer WL is formed a memory cell having a structure in which a channel is surrounded by a gate electrode.

The memory cell is of the charge trap structure. The charge storage layer 76 includes numerous traps for confining charges (electrons) and is illustratively made of a silicon nitride film.

The second dielectric film 77 is illustratively made of a silicon oxide film and serves as a potential barrier when a charge is injected from the silicon pillar SP into the charge storage layer 76, or when the charge stored in the charge storage layer 76 is diffused into the silicon pillar SP.

The first dielectric film 75 is illustratively made of a silicon oxide film and prevents the charge stored in the charge storage layer 76 from diffusing into the electrode layer WL serving as a gate electrode.

With the downscaling of the memory cell having the above structure, normal write/read operation can be performed without the diffusion layer serving as a source/drain region. Thus, in this embodiment, the memory cell includes, in the silicon pillar SP, no diffusion layer serving as a source/drain region of a different conductivity type. That is, the silicon pillar SP serves as a channel region, a source region, and a drain region in the memory cell. Furthermore, by controlling the voltage applied to the electrode layer WL, the silicon pillar SP opposed to the electrode layer WL is nearly depleted to realize the turn-off state.

As shown in FIG. 10, one silicon pillar SP is surrounded by as many memory cells MC as the electrode layers WL, and the memory cells MC are series connected in the Z direction to constitute one memory string. Such memory strings are arrayed in a matrix configuration in the X and Y direction so that a plurality of memory cells are arrayed in a three-dimensional manner in the X, Y, and Z direction.

Referring again to FIGS. 11 and 12, a gate dielectric film GD is tubularly formed on the inner peripheral wall of the through hole formed in the laminated body ML1 underlying the laminated body ML2, and a silicon pillar SP is buried inside the gate dielectric film GD. Thus, in the laminated body ML1 is provided a lower select transistor LST in which the silicon pillar SP serves as a channel and the lower select gate LSG therearound serves as a gate electrode.

A gate dielectric film GD is tubularly formed on the inner peripheral wall of the through hole formed in the laminated body ML3 overlying the laminated body ML2, and a silicon pillar SP is buried inside the gate dielectric film GD. Thus, in the laminated body ML3 is provided an upper select transistor UST in which the silicon pillar SP serves as a channel and the upper select gate USG therearound serves as a gate electrode.

The lower select transistor LST and the upper select transistor UST each have a structure in which, like the memory cell described above, a channel is surrounded by a gate electrode. However, they do not serve as memory cells, but serve to select the silicon pillar SP.

The semiconductor memory device according to this embodiment further includes a driver circuit for applying a potential to the upper end portion of the silicon pillar SP through the bit line BL, a driver circuit for applying a potential to the lower end portion of the silicon pillar SP through the cell source interconnect CSL, the contact 73, and the cell source CS, a driver circuit for applying a potential to the upper select gate USG through the upper select gate interconnect USL and the via 70, a driver circuit for applying a potential to the lower select gate LSG through the lower select gate interconnect LSL and the via 72, and a driver circuit for applying a potential to each electrode layer WL through the word line WLL and the via 71 (all the driver circuits being not shown). A P-well and an N-well (not shown) are formed in the circuit region including these driver circuits, and such elements as transistors are formed in these wells.

The semiconductor memory device according to this embodiment is a nonvolatile semiconductor memory device in which the operation of electrically erasing/writing data can be freely performed and the stored content can be retained even after power off.

The X coordinate of a memory cell is selected by selecting a bit line BL. The Y coordinate of the memory cell is selected by selecting an upper select gate USG to turn the upper select transistor UST into the conducting or non-conducting state. The Z coordinate of the memory cell is selected by selecting an electrode layer WL serving as a word line. Then, information is stored by injecting electrons into the charge storage layer 76 of the selected memory cell. The information stored in this memory cell is read by passing a sense current through the silicon pillar SP that passes through this memory cell.

Next, a sixth embodiment of the invention is described.

This embodiment relates to a method for manufacturing the semiconductor memory device according to the above fifth embodiment.

FIGS. 14A and 14B to 17 are process cross-sectional views illustrating the method for manufacturing a semiconductor memory device according to this embodiment.

First, as shown in FIGS. 11 and 12, the memory array region in a silicon substrate 61 is doped with impurity to form a cell source CS. Next, a dielectric layer 62 is formed on the cell source CS, a silicon layer serving as a lower select gate LSG is formed thereon, and a dielectric layer 63 is formed further thereon. Thus, a laminated body ML1 made of the dielectric layer 62, the lower select gate LSG, and the dielectric layer 63 is formed. Simultaneously, in the peripheral circuit region (not shown), a P-well, an N-well and the like are formed, the gates of transistors constituting the driver circuits are formed, and sources/drains are formed.

Next, a through hole extending in the Z direction (lamination direction) and reaching the cell source CS is formed in the laminated body ML1 by etching. Then, a dielectric film such as a silicon oxide film or a silicon nitride film is deposited entirely on the laminated body ML1. The dielectric film is formed on the bottom and side surface of the through hole as well as the upper surface of the laminated body ML1. Then, the dielectric film formed on the upper surface of the laminated body ML1 and the bottom of the through hole is removed illustratively by RIE (reactive ion etching). Thus, the dielectric film remains on the side surface of the through hole to serve as a gate dielectric film GD. Next, silicon is buried inside the through hole to form a silicon pillar SP in the through hole. Thus, a lower select transistor LST is formed.

Figure 14A:
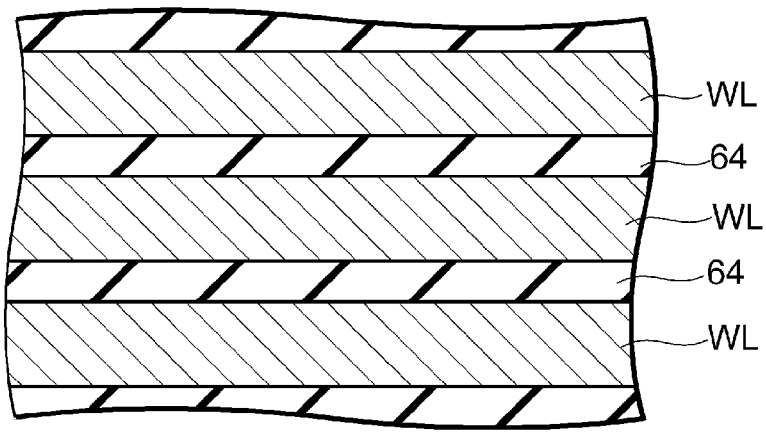
FIGS. 14A and 14B are process cross-sectional views illustrating a method for manufacturing a semiconductor memory device according to a sixth embodiment of the invention.

Next, as shown in FIG. 14A, dielectric layers 64 illustratively made of TEOS (tetraethoxysilane) and electrode layers WL illustratively made of amorphous or polycrystalline silicon are alternately laminated on the laminated body ML1 to form a laminated body ML2.

Figure 14B:
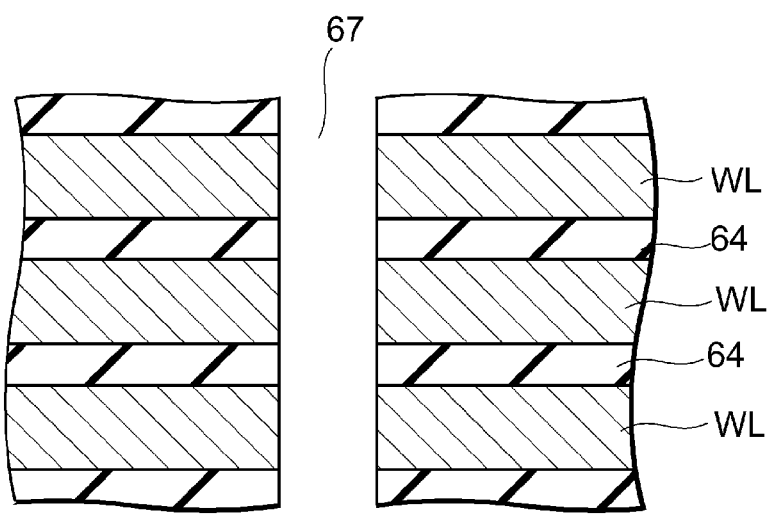

Next, as shown in FIG. 14B, a hole 67 passing through the laminated body ML2 of the dielectric layers 64 and the electrode layers WL and extending in the lamination direction thereof is formed by RIE. The hole 67 is formed directly above the silicon pillar SP of the underlying laminated body ML1 to reach that silicon pillar SP.

Figure 15A:
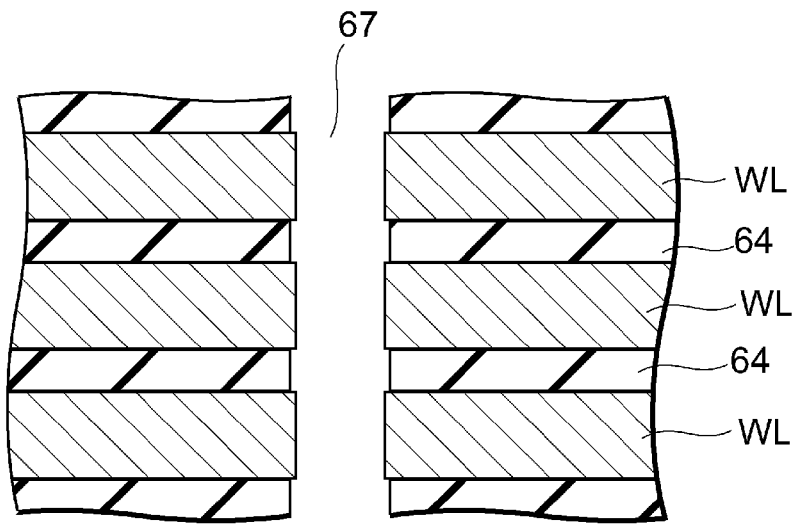
FIGS. 15A and 15B are process cross-sectional views illustrating a method for manufacturing a semiconductor memory device according to the sixth embodiment.

Next, the dielectric layer 64 facing inside the hole 67 is wet etched. In the etchant used at this time, the dielectric layer 64 is soluble, but the electrode layer WL is insoluble. Hence, as shown in FIG. 15A, only the dielectric layer 64 is set back away from the central axis of the hole 67. That is, the exposed surface of the dielectric layer 64 facing the hole 67 is set back to a first position (shown in FIG. 15A), which is more distant from the central axis of the hole 67 than the exposed surface of the electrode layer WL facing the hole 67. It is noted that this etching only needs to be isotropic, and can also be CDE (chemical dry etching) besides wet etching.

Figure 15B:
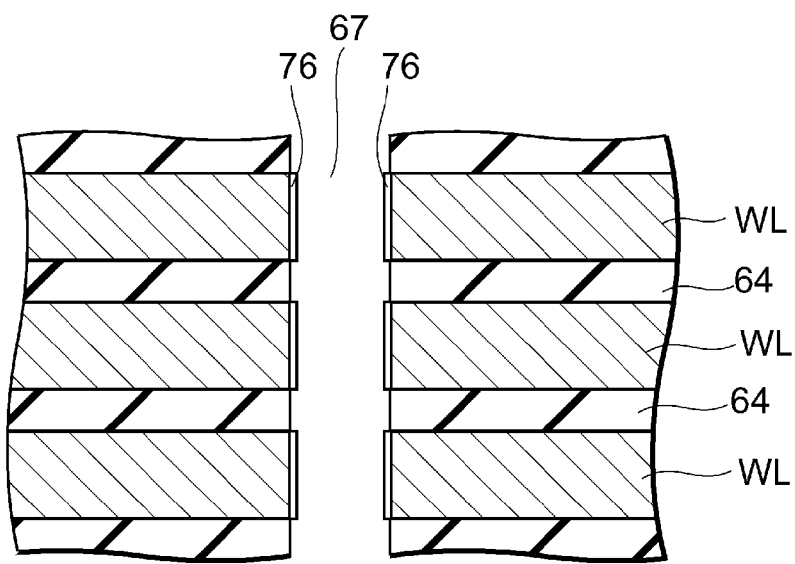

By the setback of the dielectric layer 64 in the above process, the electrode layer WL protrudes from the dielectric layer 64 toward the hole 67. Next, a thermal nitridation process is performed on the protruding portion of the electrode layer WL. Thus, as shown in FIG. 15B, a silicon nitride film 76 serving as a charge storage layer is formed in the portion of the electrode layer WL exposed to the hole 67. The silicon nitride film 76 is formed only in the exposed portion of silicon by heating the wafer, which has completed the above processes up to FIG. 15A, in a nitridizing gas atmosphere containing nitrogen (N). That is, a charge storage layer (silicon nitride film) 76 is formed only in the electrode layer WL, but not formed in the dielectric layer 64.

Next, the dielectric layer 64 facing inside the hole 67 at the above first position is wet etched again. In the etchant used at this time, the dielectric layer 64 is soluble, but the electrode layer WL and the silicon nitride film 76 are insoluble. Hence, only the dielectric layer 64 is set back further away from the central axis of the hole 67, from the first position shown in FIGS. 15A and 15B to a second position shown in FIG. 16A. It is noted that this etching also only needs to be isotropic, and can also be CDE besides wet etching.

Figure 16A:
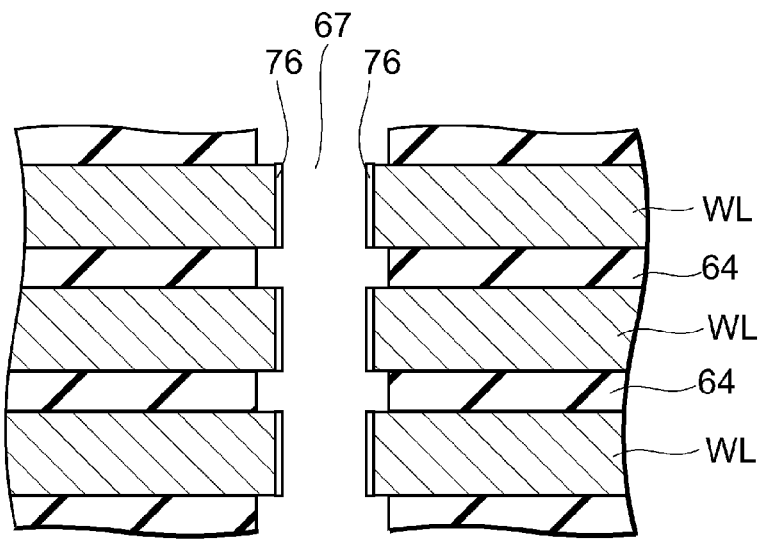
FIGS. 16A and 16B are process cross-sectional views illustrating a method for manufacturing a semiconductor memory device according to the sixth embodiment.

By the setback of the dielectric layer 64 to the above second position, as shown in FIG. 16A, the upper and lower surface of the electrode layer WL between the silicon nitride film 76 formed therein and the second position of the above dielectric layer 64 are exposed.

Then, a thermal oxidation process is performed on the exposed portion of silicon in the electrode layer WL. That is, growth of the oxide film proceeds from the exposed portion of silicon in the electrode layer WL by heating the wafer, which has completed the above processes up to FIG. 16A, in a oxidizing gas atmosphere containing oxygen (O). Oxidation proceeds from the upper and lower surface of the electrode layer WL, which are not covered with the silicon nitride film 76 and the dielectric layer 64 and are located therebetween, toward the thicknesswise central portion.

Figure 16B:
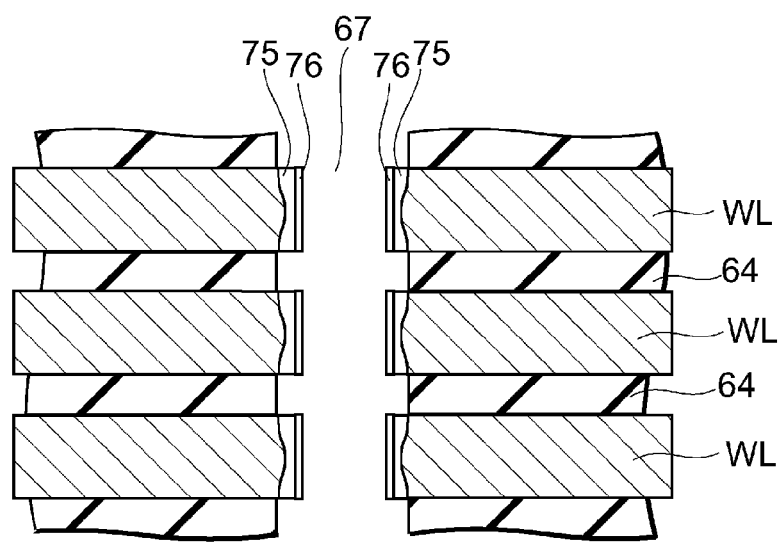

Hence, as shown in FIG. 16B, a first dielectric film (silicon oxide film) 75 having a bird's beak structure is formed on the backside (the side opposite to the portion facing the hole 67) of the silicon nitride film 76 in the electrode layer WL.

Figure 17:
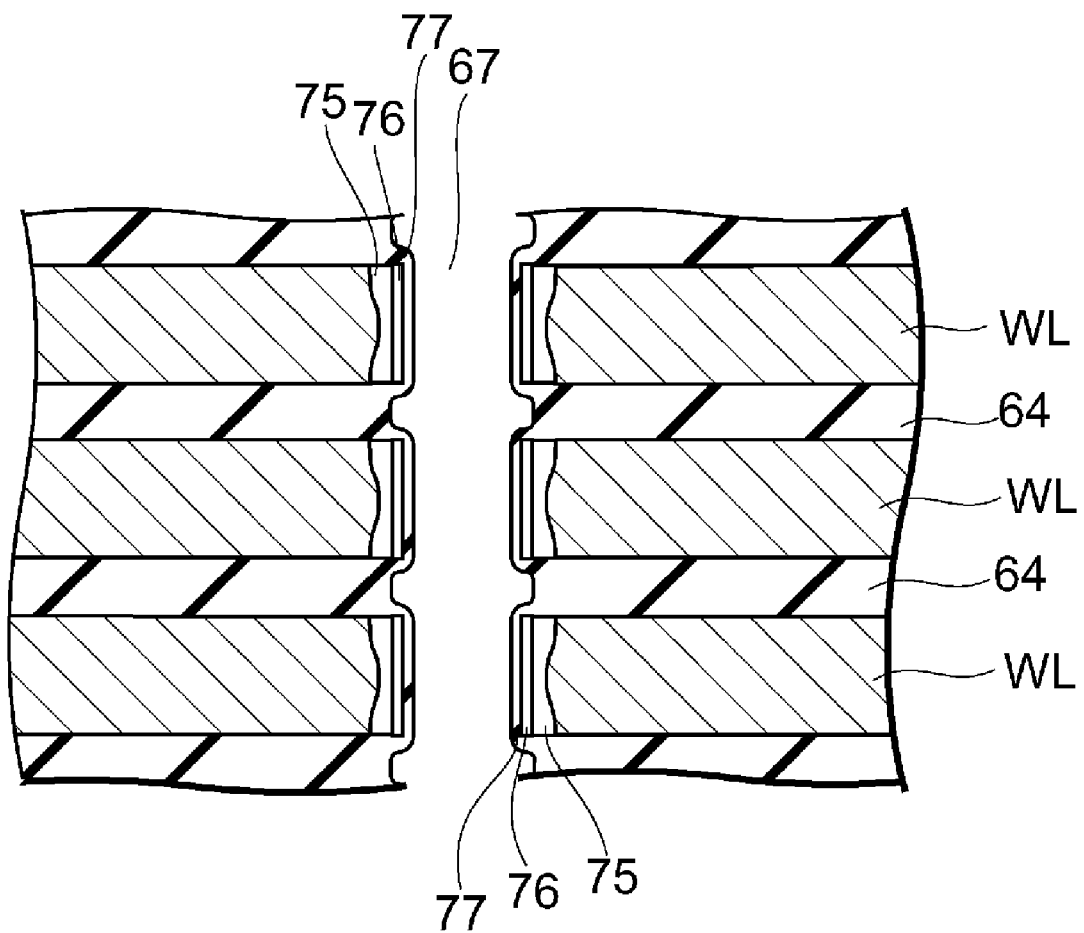
FIG. 17 is a process cross-sectional view illustrating a method for manufacturing a semiconductor memory device according to the sixth embodiment.

Next, a second dielectric film (silicon oxide film) 77 is formed illustratively by CVD (chemical vapor deposition) entirely on the sidewall portion of the above laminated body ML2 facing the hole 67. Thus, as shown in FIG. 17, the charge storage layer (silicon nitride film) 76 is covered with the second dielectric film (silicon oxide film) 77, and an ONO (oxide-nitride-oxide) film is formed on the portion of the electrode layer WL opposed to the hole 67.

Next, the silicon oxide film and the like formed at the bottom of the hole 67 are removed to expose the upper surface of the silicon pillar SP of the underlying laminated body ML1 to inside the hole 67. Then, silicon is buried inside the hole 67 illustratively by CVD. Thus, as shown in FIGS. 11 to 13, a silicon pillar SP is formed in the laminated body ML2, and a memory cell is formed at the intersection between that silicon pillar SP and the electrode layer WL. The lower end of the silicon pillar SP of the laminated body ML2 is in contact with the upper end of the silicon pillar SP of the underlying laminated body ML1.

Next, as shown in FIGS. 11 and 12, a dielectric layer 65 is formed on the laminated body ML2, a silicon layer serving as an upper select gate USG is formed thereon, and a dielectric layer 66 is formed further thereon. Thus, a laminated body ML3 made of the dielectric layer 65, the upper select gate USG, and the dielectric layer 66 is formed.

Next, a through hole extending in the Z direction (lamination direction) and reaching the silicon pillar SP of the laminated body ML2 is formed in the laminated body ML3 by etching. Then, a dielectric film such as a silicon oxide film or a silicon nitride film is deposited entirely on the laminated body ML3. This dielectric film is formed on the bottom and side surface of the through hole as well as the upper surface of the laminated body ML3.

Next, the dielectric film formed on the upper surface of the laminated body ML3 and the bottom of the through hole is removed illustratively by RIE. Thus, the dielectric film remains on the side surface of the through hole to serve as a gate dielectric film GD.

Next, the silicon pillar SP of the laminated body ML2 is exposed to the bottom of the through hole, and then silicon is buried inside the through hole to form a silicon pillar SP in the laminated body ML3. Thus, an upper select transistor UST is formed. The lower end of the silicon pillar SP of the laminated body ML3 is in contact with the upper end of the silicon pillar SP of the underlying laminated body ML2.

Next, a dielectric layer 68 is formed on the laminated body ML3, and then a via 68a is formed in the dielectric layer 68. Next, a metal film is entirely formed and patterned to form a bit line BL.

It is noted that before a hole is formed in the laminated body ML3, the dielectric layer 68 may be formed on the laminated body ML3, and then a hole (the via 68a in the dielectric layer 68) passing therethrough may be formed. After the hole is formed in the dielectric layer 68 and the laminated body ML3, a gate dielectric film GD is formed on the hole side surface of the laminated body ML3, and a silicon pillar SP is buried inside the gate dielectric film GD. At this time, the silicon pillar SP is buried also in the via 68a of the dielectric layer 68. This silicon pillar SP in the via 68a is etched away, and then a metal material is formed on the dielectric layer 68 to bury the via 68a, and patterned to form a bit line BL.

Furthermore, an upper select gate interconnect USL, a word line WLL, a lower select gate interconnect LSL, and a cell source interconnect CSL are formed. Thus, the structure shown in FIG. 9 is obtained.

According to the embodiment of the invention, as shown in FIG. 13, the charge storage layer 76 is present only between the electrode layer WL and the silicon pillar SP serving as a channel during turn-on, but absent between the dielectric layer 64 and the silicon pillar SP. That is, the charge storage layer 76 is split in the direction in which the memory cells are series connected in the lamination direction.

Hence, the charge stored in the charge storage layer 76 can be prevented from diffusing into the charge storage layer 76 of another memory cell. This allows each memory cell to stably retain the stored charge, and serves to avoid affecting the write operation on other memory cells due to the diffusion of the stored charge.

In the context of the above process for obtaining a structure in which the dielectric layer 64 between the electrode layers WL has no charge storage layer (silicon nitride film) 76, as shown in FIG. 13, this embodiment is likely to result in a structure in which the silicon pillar SP laterally intrudes into the dielectric layer 64 along the corner of the charge storage layer 76. Furthermore, between the intruding portion of the silicon pillar SP and the thicknesswise end portion of the electrode layer WL near the interface with the first dielectric film 75, only the oxide film is present, but the nitride film is absent. Hence, if the electric field concentrates thereon, gate leakage may occur in this portion.

However, in this embodiment, as described above, the silicon nitride film 76 formed earlier is used as a mask to perform thermal oxidation, and thereby a first dielectric film 75 having a bird's beak structure is obtained. Hence, the first dielectric film 75 is thicker in the end portion 75a being in contact with the dielectric layer 64 than in the central portion 75b in the thickness direction of the electrode layer WL. This serves to prevent leakage between the electrode layer WL and the above portion of the silicon pillar SP intruding into the dielectric layer 64.

Next, a seventh embodiment of the invention is described.

As shown in FIGS. 11 and 12, in the structure illustrated in the above fifth embodiment, an upper select gate USG and a lower select gate LSG are placed, respectively, above and below the laminated body ML2 including memory cells. Furthermore, a bit line BL overlies the upper select gate USG, and a cell source CS underlies the lower select gate LSG. That is, an I-shaped silicon pillar SP is provided between the bit line BL and the cell source CS.

Figure 18:
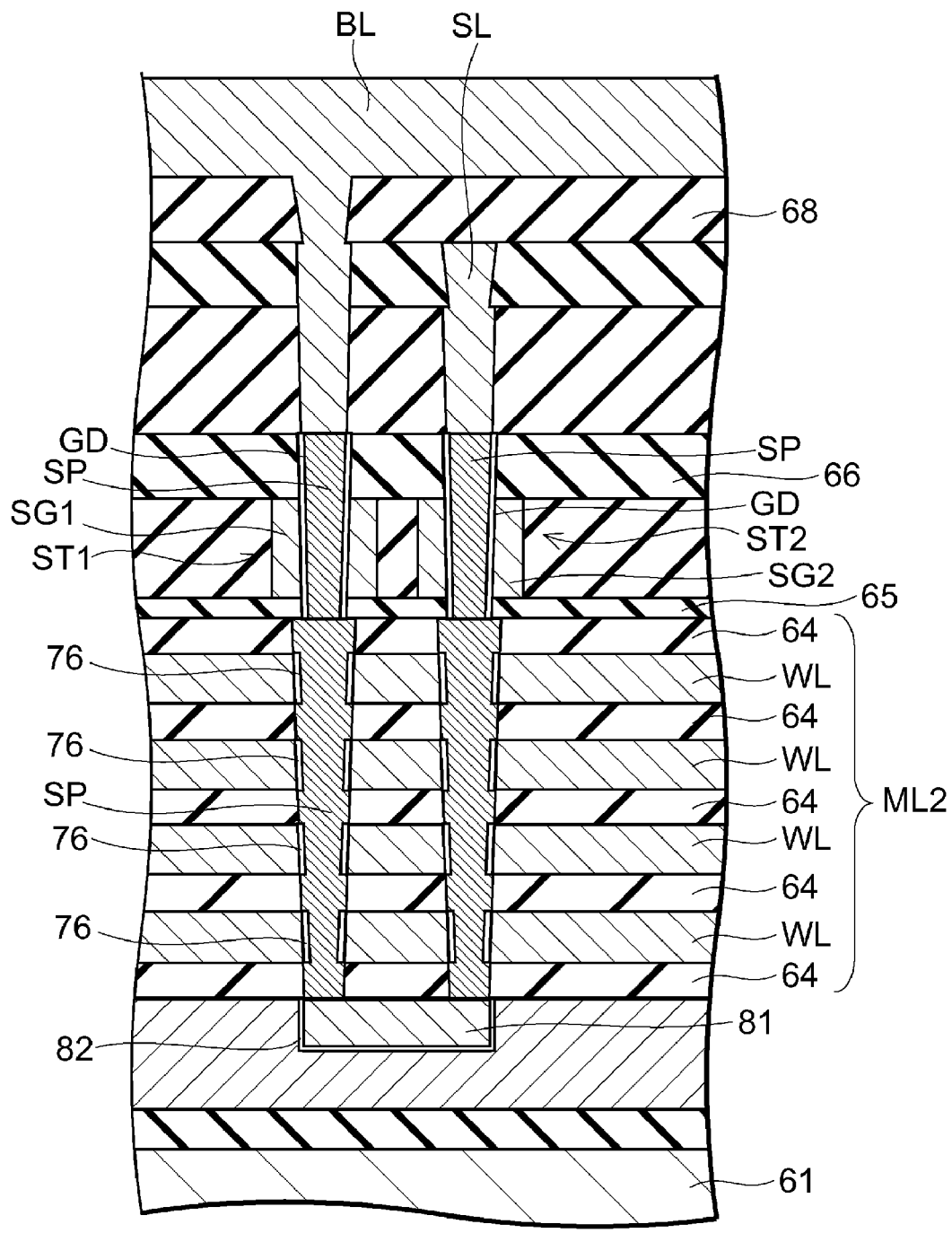
FIG. 18 is a schematic cross-sectional view in the YZ direction illustrating a semiconductor memory device according to a seventh embodiment of the invention.

In contrast, as shown in FIG. 18, in the structure of this embodiment, a U-shaped silicon pillar SP is provided between the bit line BL and the source line SL.

FIG. 18 shows a semiconductor memory device according to this embodiment, and is a schematic cross-sectional view in the YZ direction corresponding to FIG. 12 for the above fifth embodiment.

On the laminated body ML2 including memory cells, a first select transistor ST1 for turning on/off the connection between the bit line BL and the memory cells and a second select transistor ST2 for turning on/off the connection between the source line SL and the memory cells are provided. In the first select transistor ST1, a first select gate SG1 is opposed to the silicon pillar SP across a gate dielectric film GD. Likewise, in the second select transistor ST2, a second select gate SG2 is opposed to the silicon pillar SP across a gate dielectric film GD.

A bit line BL and a source line SL are provided on these select transistors ST1, ST2. The bit line BL and the source line SL are provided at different heights. In the example shown in FIG. 18, the bit line BL is located higher. The lower end portions of the silicon pillars SP of the laminated body ML2 are connected through a conductive layer 81. The conductive layer 81 is insulated from other conductive portions by a dielectric film 82.

The invention has been described with reference to the embodiments. However, the invention is not limited to these embodiments, but can be variously modified within the spirit of the invention. For example, those skilled in the art can suitably modify the above embodiments by addition, deletion, and design change of the components, or addition, omission, and condition change of the processes, and such modifications are also encompassed within the scope of the invention as long as they fall within the spirit of the invention. Specifically, the material of the charge layer is not limited to silicon nitride and the silicon-containing metal oxide. Furthermore, the material of the tunnel layer and the block layer is not limited to silicon oxide. Moreover, the shape of the conductor and the silicon layer is not limited to a cylinder, but may illustratively be a prism. Furthermore, the invention is not limited to burying a semiconductor layer entirely in the through hole, but the semiconductor layer may be shaped like a cylinder. That is, the semiconductor layer may be tubularly formed only on the portion in contact with the second dielectric film 77, and a dielectric may be buried inside the semiconductor layer.

INDUSTRIAL APPLICABILITY

This invention can realize a highly reliable semiconductor memory device and a method for manufacturing the same.

The invention claimed is:

1. A semiconductor memory device comprising:
   a substrate;
   a plurality of dielectric films and electrode films alternately laminated on the substrate and having a through hole extending in the lamination direction;
   a tunnel layer formed on an inner side surface of the through hole and made of a dielectric material;
   a charge layer formed between the tunnel layer and the electrode film and made of a material different from that of the tunnel layer;
   a block layer formed between the charge layer and the electrode film and made of a dielectric material different from that of the charge layer; and
   a conductor buried inside the through hole,
   the charge layer being split for each said electrode film.

2. A method for manufacturing a semiconductor memory device, comprising:
   forming a laminated body in which a plurality of dielectric films and electrode films are alternately laminated on a substrate and have a through hole extending in the lamination direction;
   selectively forming a charge layer in a region of an inner surface of the through hole corresponding to the electrode film;
   forming a block layer between the charge layer and the electrode film, the block layer being made of a dielectric material different from that of the charge layer;
   forming a tunnel layer on an inner side surface of the through hole, the tunnel layer being made of a dielectric material different from that of the charge layer; and
   burying a conductor inside the through hole.

3. The method for manufacturing a semiconductor memory device according to claim 2, wherein
   said forming a laminated body includes forming the electrode film from silicon,
   said forming a charge layer includes selectively nitridizing silicon exposed to said region,
   said forming a block layer includes oxidizing a portion of the electrode film being in contact with the charge layer, and
   said forming a tunnel layer includes forming a silicon oxide layer on the inner surface of the through hole.

4. The method for manufacturing a semiconductor memory device according to claim 3, wherein
   said selectively nitridizing silicon is performed by exposure to nitrogen gas at a pressure of 0.5 Torr or more, and
   said oxidizing a portion in contact with the charge layer is performed by exposure to steam ($H_2O$) at a pressure of 2 atmospheres or more.

5. The method for manufacturing a semiconductor memory device according to claim 2, wherein
   said forming a laminated body includes forming the electrode film from silicon,
   said forming a charge layer includes:
   forming a metal film entirely on the inner side surface of the through hole;
   causing the metal forming the metal film to react with silicon forming the electrode film to silicidize a portion of the metal film being in contact with the electrode film; and
   removing the non-silicidized portion of the metal film,
   said forming a block layer includes oxidizing a portion of the electrode film being in contact with the charge layer, and
   said forming a tunnel layer includes forming a silicon oxide layer on the inner surface of the through hole.

6. A semiconductor memory device comprising:
   a semiconductor substrate;
   a laminated body provided on the semiconductor substrate and including a plurality of electrode layers and a plurality of dielectric layers alternately laminated;
   a semiconductor layer provided inside a hole formed through the laminated body,
   the semiconductor layer extending in the lamination direction of the electrode layers and the dielectric layers; and
   a charge storage layer provided only between the electrode layer and the semiconductor layer and split in the lamination direction.

7. The semiconductor memory device according to claim 6, wherein the charge storage layer is a dielectric film including a charge trap.

8. The semiconductor memory device according to claim 7, wherein the charge storage layer is a silicon nitride film.

9. The semiconductor memory device according to claim 6, further comprising:
   a first dielectric film provided between the electrode layer and the charge storage layer; and
   a second dielectric film provided between the charge storage layer and the semiconductor layer,
   wherein the first dielectric film is thicker in the end portion being in contact with the dielectric layer than in the central portion in the thickness direction of the electrode layer.

10. A method for manufacturing a semiconductor memory device, comprising:
    alternately laminating a plurality of electrode layers and a plurality of dielectric layers on a semiconductor substrate to form a laminated body thereof;

forming a hole passing through the laminated body and extending in the lamination direction of the electrode layers and the dielectric layers;

setting back an exposed surface of the dielectric layer facing the hole to a first position which is located away from the hole relative to an exposed surface of the electrode layer facing the hole;

forming a nitride film by performing thermal nitridation on a protruding portion of the electrode layer protruding toward the hole as a result of the setting back of the dielectric layer;

further setting back the dielectric layer from the first position to a second position; and forming an oxide film by performing thermal oxidation on a portion of the electrode layer between the nitride film formed therein and the second position.

* * * * *